(12) United States Patent
Suzuki et al.

(10) Patent No.: US 12,453,130 B2
(45) Date of Patent: Oct. 21, 2025

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Akio Suzuki, Atsugi (JP); Haruyuki Baba, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 771 days.

(21) Appl. No.: 17/617,411

(22) PCT Filed: Jun. 5, 2020

(86) PCT No.: PCT/IB2020/055298
§ 371 (c)(1),
(2) Date: Dec. 8, 2021

(87) PCT Pub. No.: WO2020/254904
PCT Pub. Date: Dec. 24, 2020

(65) Prior Publication Data
US 2022/0254932 A1    Aug. 11, 2022

(30) Foreign Application Priority Data

Jun. 21, 2019  (JP) ................ 2019-115134
Aug. 30, 2019  (JP) ................ 2019-158306

(51) Int. Cl.
*H10D 30/67*    (2025.01)
*H10D 30/01*    (2025.01)

(52) U.S. Cl.
CPC ....... *H10D 30/6755* (2025.01); *H10D 30/031* (2025.01)

(58) Field of Classification Search
CPC . H01L 27/092–0928; H01L 29/04–045; H01L 29/16–1608; H01L 29/18–185;
(Continued)

(56) References Cited

U.S. PATENT DOCUMENTS 8,921,849 B2   12/2014  Takemura
9,184,286 B2   11/2015  Nakano
(Continued)

FOREIGN PATENT DOCUMENTS

CN    107452810 A    12/2017
JP    2006-041127 A   2/2006
(Continued)

OTHER PUBLICATIONS

International Search Report (Application No. PCT/IB2020/055298) dated Sep. 1, 2020.
(Continued)

*Primary Examiner* — Moin M Rahman
(74) *Attorney, Agent, or Firm* — Eric J. Robinson; Robinson Intellectual Property Law Office, P.C.

(57) ABSTRACT

A semiconductor device for high power consumption is provided. The semiconductor device includes a substrate, a first conductor over the substrate, a first metal oxide over the first conductor, a first oxide over the first metal oxide, a second oxide over the first oxide, a first insulator over the second oxide, a second conductor over the first insulator, a second insulator over the second conductor, a third insulator in contact with a side surface of the second conductor, a side surface of the first insulator, and a side surface of the second insulator, a second metal oxide over the second oxide, the second insulator, and the third insulator, and a third conductor over the second metal oxide. The second conductor includes a region overlapping with the second oxide. The third conductor includes a region in contact with the second
(Continued)

metal oxide. The second metal oxide includes a region in contact with the second oxide. The carrier concentration of the second oxide is lower than the carrier concentration the first oxide.

8 Claims, 20 Drawing Sheets

(58) Field of Classification Search
CPC ... H01L 29/22–2206; H01L 29/36–365; H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/48; H01L 21/02603; H01L 21/30604; H01L 25/105; H01L 21/30625; H01L 21/6835; B81C 2203/0728; B81C 2203/0735; B81C 2203/0742; H10D 84/0193; H10D 84/853; H10D 84/85; H10D 30/6728; H10D 30/6733; H10D 30/6735; H10D 62/118; H10D 89/931; H10D 64/252; H10D 84/0188; H10D 84/201; H10D 18/60; H10D 30/6755; H10D 30/031; H10D 30/635; H10D 99/00; H10D 62/80; H10D 64/513; H10D 64/519; H10D 62/121; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 30/62–6219; H10D 30/024–0245; H10D 84/0158; H10D 86/011; H10D 84/834; H10D 86/215; H02K 15/027; A23B 2/783; A45C 11/003; A61K 40/4218; H10F 77/955; H10H 20/826; B82Y 10/00; H10B 12/36; H10B 12/056
See application file for complete search history.

(56) References Cited

U.S. PATENT DOCUMENTS

| | | | |
|---|---|---|---|
| 9,406,744 | B2 | 8/2016 | Nakano |
| 9,406,796 | B2 | 8/2016 | Yamashita et al. |
| 9,537,478 | B2 | 1/2017 | Takahashi |
| 9,698,216 | B2 | 7/2017 | Nakano |
| 10,147,681 | B2 | 12/2018 | Yamazaki et al. |
| 10,388,796 | B2 | 8/2019 | Yamazaki et al. |
| 10,714,629 | B2 | 7/2020 | Saito et al. |
| 10,833,166 | B2 | 11/2020 | Yamamoto et al. |
| 10,868,045 | B2 | 12/2020 | Yamazaki |
| 2010/0032668 | A1* | 2/2010 | Yamazaki ......... H01L 29/66742 257/E29.296 |
| 2013/0200375 | A1* | 8/2013 | Yamazaki ........... H01L 21/0237 438/479 |
| 2014/0001465 | A1* | 1/2014 | Yamazaki ............... H01L 29/24 257/43 |
| 2015/0001532 | A1 | 1/2015 | Yamazaki et al. |
| 2016/0254291 | A1* | 9/2016 | Yamazaki .............. H10D 86/60 257/43 |
| 2017/0170211 | A1 | 6/2017 | Yamazaki |
| 2018/0046005 | A1* | 2/2018 | Yoon ................... G02F 1/13338 |
| 2018/0166392 | A1* | 6/2018 | Yamazaki ........... H01L 27/0688 |
| 2018/0166578 | A1* | 6/2018 | Yamazaki ........... H01L 29/7869 |
| 2019/0067375 | A1 | 2/2019 | Karda et al. |
| 2019/0237581 | A1 | 8/2019 | Saito et al. |
| 2020/0006506 | A1 | 1/2020 | Lee et al. |

FOREIGN PATENT DOCUMENTS

| | | |
|---|---|---|
| JP | 2013-062461 A | 4/2013 |
| JP | 2014-195077 A | 10/2014 |
| JP | 2015-076540 A | 4/2015 |
| JP | 2017-130647 A | 7/2017 |
| JP | 2018-082102 A | 5/2018 |
| JP | 2018-098291 A | 6/2018 |
| JP | 2018-098505 A | 6/2018 |
| JP | 2018-129503 A | 8/2018 |
| JP | 2019-134077 A | 8/2019 |
| TW | 201834197 | 9/2018 |
| WO | WO-2012/105609 | 8/2012 |
| WO | WO-2015/004883 | 1/2015 |
| WO | WO-2018/012598 | 1/2018 |

OTHER PUBLICATIONS

Written Opinion (Application No. PCT/IB2020/055298) dated Sep. 1, 2020.
Nakamura.A et al., "Growth of ZnO-based Alloy Films and the Schottky Contact", Journal of the Surface Science Society of Japan , Aug. 22, 2010, vol. 31, No. 12, pp. 637-642, The Surface Science Society of Japan.
Toda.K, "Detection of gaseous hydrides by metal-titanium oxide gas sensors.", Bunseki kagaku (analytical chemistry), May 18, 1990, vol. 39, No. 11, pp. 611-615.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

(56) References Cited

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner 210,242,243,230a,230b,245

210,242,243,230a,230b,245

FIG. 9A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 9B
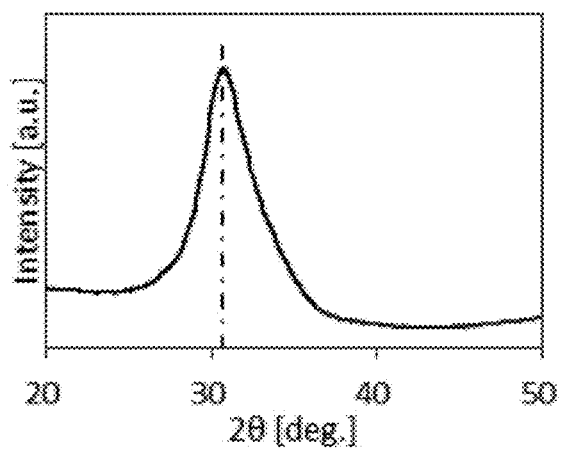
FIG. 9C
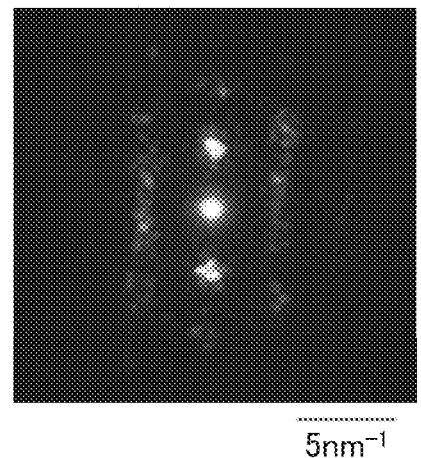

50 nm 50 nm 10 nm 3 nm

SEMICONDUCTOR DEVICE AND METHOD FOR MANUFACTURING SEMICONDUCTOR DEVICE

TECHNICAL FIELD

One embodiment of the present invention relates to a transistor, a semiconductor device, and an electronic device. One embodiment of the present invention relates to a method for manufacturing a semiconductor device. One embodiment of the present invention relates to a semiconductor wafer and a module.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, or the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate has been attracting attention. The transistor is applied to a wide range of electronic devices such as an integrated circuit (IC) or an image display device (also simply referred to as a display device). Furthermore, examples of the transistor include what is called a power transistor which is applied to power supply circuit or the like as a power source. A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a semiconductor device having favorable electrical characteristics. Another object of one embodiment of the present invention is to provide a semiconductor device for high power consumption. Another object is to provide a semiconductor device having favorable reliability.

Note that the description of these objects does not preclude the existence of other objects. One embodiment of the present invention does not necessarily achieve all these objects. Objects other than these are apparent from the description of the specification, the drawings, the claims, and the like and objects other than these can be derived from the description of the specification, the drawings, the claims, and the like.

Means for Solving the Problems

One embodiment of the present invention is a semiconductor device including a substrate, a first conductor over the substrate, a first metal oxide over the first conductor, a first oxide over the first metal oxide, a second oxide over the first oxide, a first insulator over the second oxide, a second conductor over the first insulator, a second insulator over the second conductor, a third insulator in contact with a side surface of the second conductor, a side surface of the first insulator, and a side surface of the second insulator, a second metal oxide over the second oxide, the second insulator, and the third insulator, and a third conductor over the second metal oxide. The second conductor includes a region overlapping with the second oxide. The third conductor includes a region in contact with the second metal oxide. The second metal oxide includes a region in contact with the second oxide. The carrier concentration of the second oxide is lower than the carrier concentration of the first oxide. The carrier concentration of the first metal oxide is higher than the carrier concentration of the first oxide. The carrier concentration of the second metal oxide is higher than the carrier concentration of the first oxide.

Another embodiment of the present invention is a semiconductor device including a substrate, a first conductor over the substrate, a first metal oxide over the first conductor, a first oxide over the first metal oxide, a second oxide over the first oxide, a second metal oxide over the second oxide, a first insulator over the second oxide, a second conductor over the first insulator, a second insulator over the second metal oxide, the first insulator, and the second conductor, and a third conductor over the second metal oxide and the second insulator. The second oxide and the second metal oxide include an opening. The first insulator is in contact with a side portion of the opening and a bottom portion of the opening. The second conductor includes a region overlapping with the second oxide. The third conductor includes a region in contact with the second metal oxide. The second metal oxide includes a region in contact with the second oxide. The carrier concentration of the second oxide is lower than the carrier concentration of the first oxide. The carrier concentration of the first metal oxide is higher than the carrier concentration of the first oxide. The carrier concentration of the second metal oxide is higher than the carrier concentration of the first oxide.

In the above, the first oxide and the second oxide preferably contain In, an element M (M is Al, Ga, Y, or Sn), and Zn.

In the above, the first metal oxide and the second metal oxide preferably contain In and one or more of Sn, W, Ti, and Si.

Another embodiment of the present invention is a method for manufacturing a semiconductor device including the steps of forming a first conductor over a substrate; forming a first metal oxide over the first conductor, forming a first oxide over the first metal oxide; forming a second oxide over the first oxide; forming a second metal oxide over the second oxide; forming an opening in the second metal oxide and the second oxide by a lithography method; depositing a first insulating film over the second metal oxide and in the opening; depositing a first conductive film over the first insulating film; forming a first insulator and a second conductor embedded inside the opening by polishing the first insulating film and the first conductive film so as to reach a surface of the second metal oxide by a CMP method; forming a second insulator in contact with the second metal oxide, the first insulator, and the second conductor; and forming a third conductor over the second metal oxide and the second insulator.

In the above, the first conductive film, the first metal oxide, the first oxide, and the second oxide are preferably deposited successively under reduced pressure using an apparatus including a plurality of treatment chambers.

Effect of the Invention

According to one embodiment of the present invention, a semiconductor device having favorable electrical characteristics can be provided. According to another embodiment of the present invention, a semiconductor device for high power consumption can be provided. According to another embodiment of the present invention, a semiconductor device having favorable reliability can be provided.

Note that the description of these effects does not preclude the existence of other effects. One embodiment of the present invention does not necessarily achieve all these effects. Effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 9A is a table showing classifications of crystal structures of IGZO of one embodiment of the present invention. FIG. 9B is a graph showing an XRD spectrum of a CAAC-IGZO film of one embodiment of the present invention. FIG. 9C is an image showing a nanobeam electron diffraction pattern of a CAAC-IGZO film of one embodiment of the present invention.

MODE FOR CARRYING OUT THE INVENTION

Figure 1A:
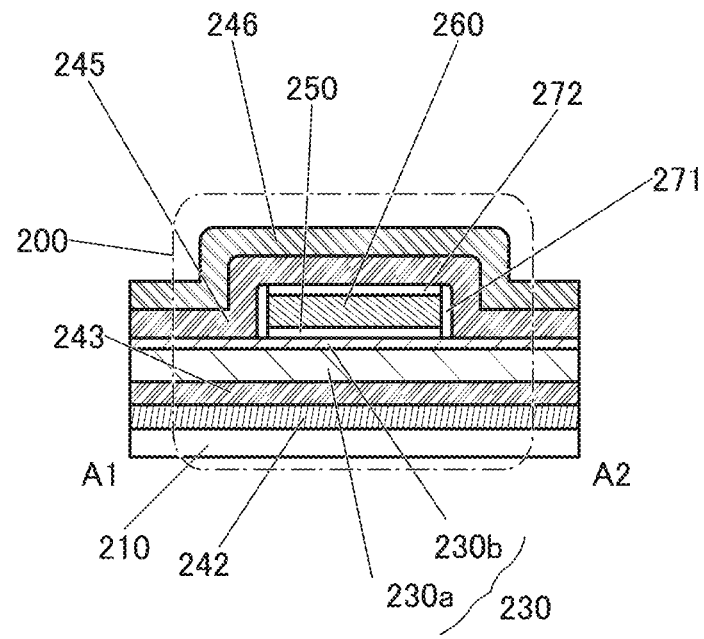
FIG. 1A is a cross-sectional view of a semiconductor device of one embodiment of the present invention.

Hereinafter, embodiments will be described with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not necessarily limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might be omitted.

In this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that impurities in a semiconductor refer to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. Note that water also serves as an impurity in some cases. In addition, in the case of an oxide semiconductor, oxygen vacancies (also referred to as Vo) are formed by entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, normally off means drain current per micrometer of channel width flowing through a transistor being $1 \times 10^{-20}$ A or less at room temperature, $1 \times 10^{-18}$ A or less at 85° C., or $1 \times 10^{-16}$ A or less at 125° C. when a potential is not applied to a gate or a ground potential is applied to the gate.

Embodiment 1

In this embodiment, an example of a semiconductor device including a transistor 200 of one embodiment of the present invention and a manufacturing method thereof is described with reference to FIG. 1 to FIG. 8.

Structure Example 1 of Semiconductor Device

A structure of a semiconductor device including the transistor 200 is described with reference to FIG. 1A. FIG. 1A is a cross-sectional view of the semiconductor device including the transistor 200.

As illustrated in FIG. 1A, the semiconductor device including the transistor 200 of one embodiment of the present invention includes a substrate 210, a conductor 242 over the substrate 210, a metal oxide 243 over the conductor 242, an oxide 230a over the metal oxide 243, an oxide 230b over the oxide 230a, an insulator 250 over the oxide 230b, a conductor 260 over the insulator 250, an insulator 272 over the conductor 260, an insulator 271 in contact with a side surface of the insulator 250, a side surface of the conductor 260, and a side surface of the insulator 272, a metal oxide 245 covering the oxide 230b, the insulator 271, the insulator 272, and the conductor 260, and a conductor 246 over the metal oxide 245. The conductor 260 includes a region overlapping with the oxide 230b, the conductor 246 includes a region in contact with the metal oxide 245, and the metal oxide 245 includes a region in contact with the oxide 230b.

Note that the carrier concentration of the oxide 230b is preferably lower than the carrier concentration of the oxide 230a. The carrier concentration of the metal oxide 243 is preferably higher than the carrier concentration of the oxide 230a, and the carrier concentration of the metal oxide 245 is preferably higher than the carrier concentration of the oxide 230a.

Here, the conductor 260 functions as a gate of the transistor 200, and the substrate 210 and the conductor 242 function as a drain. The conductor 246 functions as a source. The insulator 250 functions as a gate insulator. Part of the oxide 230a and part of the oxide 230b serve as a channel formation region. That is, the transistor 200 is a vertical channel transistor.

In the transistor 200, a metal oxide functioning as a semiconductor (hereinafter, also referred to as an oxide semiconductor) is preferably used as the oxide 230a and the oxide 230b that include the channel formation region. Note that in this specification, the oxide 230a and the oxide 230b are collectively referred to as an oxide 230.

The metal oxide functioning as a semiconductor has a band gap of preferably 2 eV or higher, further preferably 2.5 eV or higher. With the use of a metal oxide having such a wide band gap, the off-state current of the transistor can be reduced.

The transistor 200 using an oxide semiconductor in its channel formation region has an extremely low leakage current (off-state current) in a non-conduction state; thus, a semiconductor device with low power consumption can be provided.

For example, as the oxide 230a and the oxide 230b, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M Furthermore, as the oxide 230a and the oxide 230b, an In—Ga oxide or an In—Zn oxide may be used. Moreover, as the oxide 230a and the oxide 230b, a Ga—Zn oxide, tin oxide, copper oxide, a nickel oxide, or an RbCd oxide may be used.

As the metal oxide 243 in contact with the conductor 242 and the metal oxide 245 in contact with the conductor 246, a conductive oxide is preferably used. It is particularly preferable to use a conductive oxide in which generation of carriers depends on not only oxygen vacancies but also a substitutional impurity donor. Accordingly, carriers caused by an impurity donor exist even when oxygen vacancies in the metal oxide 243 and the metal oxide 245 are repaired by excess oxygen, whereby a decrease in the carrier density of the metal oxide 243 and the metal oxide 245 can be inhibited. Thus, carriers are probably generated even in a conductive oxide having a small amount of oxygen vacancies. Since the metal oxide 243 and the metal oxide 245 have a high carrier concentration, an ohmic contact can be made between the conductor 242 and the metal oxide 243. Similarly, an ohmic contact can be made between the conductor 246 and the metal oxide 245.

The metal oxide 243 and the metal oxide 245 preferably contain indium and one or more of tin, tungsten, titanium, and silicon. For example, an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used.

Alternatively, zinc oxide to which gallium is added, titanium oxide to which niobium is added, or ruthenium oxide may be used.

As illustrated in FIG. 1A, the transistor 200 is a vertical channel transistor. First, when an appropriate positive potential is applied to the conductor 260 functioning as a gate, a channel is formed in the oxide 230b with the insulator 250 functioning as a gate insulator provided therebetween. Next, carriers flow from the conductor 246 functioning as a source to the conductor 242 and the substrate 210, which function as a drain, through the metal oxide 245, the channel formation region of the oxide 230b, the channel formation region of the oxide 230a, and the metal oxide 243. That is, when bottom surfaces of films included in the transistor 200 are used as a reference, carriers flow in a direction perpendicular to the bottom surfaces. That is, the channel is formed in the longitudinal direction. In this embodiment, since the transistor 200 is an n-channel transistor, carriers are electrons.

Here, since an ohmic contact is made between the conductor 242 and the metal oxide 243 and an ohmic contact is made between the conductor 246 and the metal oxide 245, an energy barrier is small in a path through which electrons flow, so that a large amount of current can be obtained. Furthermore, when the transistor 200 has such a structure, the path through which electrons flow, i.e., a cross sectional area of the current path can be larger than that of a planar transistor, so that a large amount of on-state current can be obtained. Accordingly, the semiconductor device including the transistor 200 is suitable for a semiconductor device for high power consumption, for example, a semiconductor device including a power transistor.

The transistor 200 can be formed by mainly stacking thin films; thus, the number of lithography steps can be minimized. Accordingly, the semiconductor device including the transistor 200 can be manufactured at low manufacturing cost.

In a manufacturing process of the transistor 200, heat treatment is preferably performed with a surface of the oxide 230b exposed. The heat treatment is performed at higher than or equal to 100° C. and lower than or equal to 600° C., preferably higher than or equal to 350° C. and lower than or equal to 400° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 230 can promote a reaction in which oxygen vacancies in the oxide 230 are repaired with supplied oxygen, i.e., a reaction of "Vo+O→null". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

Note that the conductor 242, the metal oxide 243, the oxide 230a, and the oxide 230b are preferably deposited successively without being exposed to the atmospheric environment. The deposition without exposure to the atmospheric environment can prevent impurities or moisture from the atmospheric environment from being attached onto the conductor 242, the metal oxide 243, the oxide 230a, and the oxide 230b and keep cleanliness of the interface between the conductor 242 and the metal oxide 243 and its vicinity, the interface between the metal oxide 243 and the oxide 230a and its vicinity, and the interface between the oxide 230a and the oxide 230b and its vicinity, which is preferable. An apparatus capable of successive deposition will be described later.

For the conductor 242 and the conductor 246, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

The insulator 250 functions as a gate insulator. The insulator 250 is preferably positioned in contact with a top surface of the oxide 230b. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

For the insulator 250, an oxide material from which part of oxygen is released by heating, in other words, an insulating material including an excess-oxygen region is preferably used. An oxide that releases oxygen by heating is an oxide film in which the amount of released oxygen molecules is greater than or equal to $1.0 \times 10^{18}$ molecules/cm$^{-3}$, preferably greater than or equal to $1.0 \times 10^{19}$ molecules/cm$^{-3}$, further preferably greater than or equal to $2.0 \times 10^{19}$ molecules/cm$^{-3}$ or greater than or equal to $3.0 \times 10^{20}$ molecules/cm$^{-3}$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C. When an insulator that releases oxygen by heating is provided as the insulator 250 in contact with the top surface of the oxide 230b, oxygen can be efficiently supplied to the channel formation region of the oxide 230b and oxygen vacancies in the channel formation region of the oxide 230b can be reduced. Thus, a transistor that has stable electrical characteristics with small variation in electrical characteristics and improved reliability can be provided. Furthermore, the concentration of impurities such as water and hydrogen in the insulator 250 is preferably reduced.

Although the insulator 250 is illustrated as a single layer in FIG. 1A, a stacked-layer structure of two or more layers may be employed. In the case where the insulator 250 has a stacked-layer structure including two layers, it is preferable that a lower layer of the insulator 250 be formed using an insulator that releases oxygen by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen contained in the lower layer of the insulator 250 can be inhibited.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like, or a metal oxide that can be used as the oxide 230 can be used as the upper layer of the insulator 250. In particular, an insulator containing an oxide of one or both of aluminum and hafnium is preferably used.

The conductor 260 functions as a gate of the transistor 200. Although the conductor 260 has a single-layer structure in FIG. 1A, the conductor 260 may have a two-layer structure or a stacked-layer structure of three or more layers.

In the case where the conductor 260 has a stacked-layer structure, a lower layer of the conductor 260 is probably formed using a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

The lower layer of the conductor 260 has a function of inhibiting diffusion of oxygen, in which case an upper layer of the conductor 260 can be inhibited from being oxidized by oxygen contained in the insulator 250, and a decrease in conductivity of the conductor 260 can be inhibited. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the upper layer of the conductor 260. The upper layer of the conductor 260 may have a stacked-layer structure; for example, a stacked-layer structure of titanium or titanium nitride and the above conductive material may be employed.

The insulator 271 is positioned in contact with the side surface of the conductor 260, and the insulator 272 is positioned in contact with the top surface of the conductor 260. Accordingly, the insulator 271 and the insulator 272 preferably function as a barrier insulating film at least against oxygen. For example, the insulator 271 and the insulator 272 preferably have a function of more inhibiting diffusion of oxygen as compared to the insulator 250. An insulator containing an oxide of one or both of aluminum and hafnium is preferably deposited as each of the insulator 271 and the insulator 272, for example.

<Constituent Materials of Semiconductor Device>

Constituent materials that can be used for the semiconductor device are described below.

<<Substrate>>

As a substrate where the transistor 200 is formed, a semiconductor substrate or a conductor substrate is used, for example. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Examples of the conductor substrate include a graphite substrate, a metal substrate, an alloy substrate, and a conductive resin substrate. Other examples include a substrate including a metal nitride and a substrate including a metal oxide. Other examples include a semiconductor substrate provided with a conductor and a conductor substrate provided with a semiconductor. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. By contrast, when a material with a low relative permittivity is used for the insulator functioning as an interlayer film, parasitic capacitance generated between wirings can be reduced. Accordingly, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon oxide to which fluorine is added, silicon oxide to which carbon is added, silicon oxide to which carbon and nitrogen are added, porous silicon oxide, and a resin.

When a transistor using a metal oxide is surrounded by insulators having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as a gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide where the channel is formed can be captured in some cases. Alternatively, hydrogen entering from an external insulator or the like can be captured in some cases.

The oxide 230 is preferably formed using a metal oxide functioning as a semiconductor (an oxide semiconductor). A metal oxide that can be used as the oxide 230 of the present invention is described below.

<Metal Oxide>

Described in this embodiment is a metal oxide functioning as a semiconductor (hereinafter also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor is explained with reference to FIG. 9A. FIG. 9A is a diagram showing the classification of crystal structures of an oxide semiconductor, typically IGZO (a metal oxide containing In, Ga, and Zn).

As shown in FIG. 9A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 9A are in an intermediate state between "Amorphous" and "Crystal", and belong to a new crystalline phase. In other words, these structures are completely different from "Amorphous", which is energetically unstable, and "Crystal".

A crystal structure of a film or a substrate can be analyzed with an X-ray diffraction (XRD) spectrum. FIG. 9B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 9B and obtained by GIXD measurement is hereinafter simply referred to as an XRD spectrum. The CAAC-IGZO film in FIG. 9B has a composition in the vicinity of In:Ga:Zn=4:2:3 [atomic ratio]. The CAAC-IGZO film in FIG. 9B has a thickness of 500 nm.

As shown in FIG. 9B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 9B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (also referred to as nanobeam electron diffraction pattern). FIG. 9C shows a diffraction pattern of the CAAC-IGZO film. FIG. 9C shows a diffraction pattern obtained by NBED in which an electron beam is incident in the direction parallel to the substrate. The CAAC-IGZO film in FIG. 9C has a composition in the vicinity of In:Ga:Zn=4:2:3 [atomic ratio]. In the nanobeam electron diffraction method, electron diffraction is performed with a probe diameter of 1 nm.

As shown in FIG. 9C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 9A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS includes a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

An a-like OS is an oxide semiconductor having a structure between those of the nc-OS and an amorphous oxide semiconductor. The a-like OS contains a void or a low-density region. That is, the a-like OS has low crystallinity compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge captured by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of impurities in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^{-3}$, preferably lower than or equal to $2 \times 10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^{-3}$, preferably lower than or equal to $2 \times 10^{16}$ atoms/cm$^{-3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

<<Other Semiconductor Material>>

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as the van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used for the oxide 230, for example. Specific examples of chalcogenide of transition metals that can be used for the oxide 230 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

Structure Example 2 of Semiconductor Device

Figure 1B:
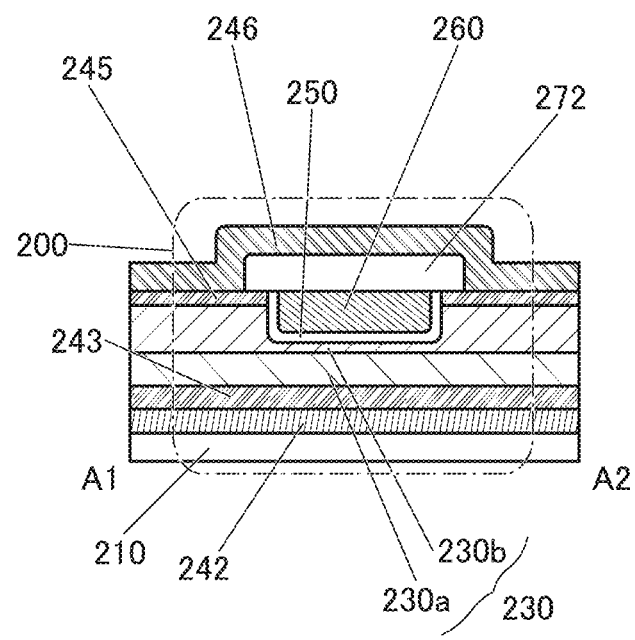
FIG. 1B is a cross-sectional view of a semiconductor device of one embodiment of the present invention.

A structure of a semiconductor device including the transistor 200, which is different from the structure illustrated in FIG. 1A, is described with reference to FIG. 1B. FIG. 1B is a cross-sectional view of the semiconductor device including the transistor 200.

Note that in the semiconductor device illustrated in FIG. 1B, components having the same functions as the components included in the semiconductor device described in <Structure example 1 of semiconductor device> are denoted by the same reference numerals. Note that the materials described in detail in <Structure example 1 of semiconductor device> can also be used as constituent materials of the semiconductor device in this section.

As illustrated in FIG. 1B, the semiconductor device including the transistor 200 of one embodiment of the present invention includes the substrate 210, the conductor 242 over the substrate 210, the metal oxide 243 over the conductor 242, the oxide 230a over the metal oxide 243, the oxide 230b over the oxide 230a, the insulator 250 over the oxide 230b, the conductor 260 over the insulator 250, the metal oxide 245 over the oxide 230b, the insulator 272 over the metal oxide 245, and the conductor 246 over the metal oxide 245 and the insulator 272. The oxide 230b and the metal oxide 245 include an opening, and the insulator 250 is positioned in contact with a side portion and a bottom portion of the opening. The conductor 260 is positioned such that a bottom portion of the conductor 260 and the side surface of the conductor 260 are in contact with the insulator 250. The conductor 260 includes a region overlapping with the oxide 230b, the conductor 246 includes a region in contact with the metal oxide 245, and the metal oxide 245 includes a region in contact with the oxide 230b.

Note that the carrier concentration of the oxide 230b is preferably lower than the carrier concentration of the oxide 230a. The carrier concentration of the metal oxide 243 is preferably higher than the carrier concentration of the oxide 230a, and the carrier concentration of the metal oxide 245 is preferably higher than the carrier concentration of the oxide 230a.

Here, the conductor 260 functions as a gate of the transistor 200, and the substrate 210 and the conductor 242 function as a drain. The conductor 246 functions as a source. The insulator 250 functions as a gate insulator. Part of the oxide 230a and part of the oxide 230b serve as a channel formation region. That is, the transistor 200 is a vertical channel transistor.

The semiconductor device illustrated in FIG. 1B is different from the semiconductor device illustrated in FIG. 1A in that the opening is provided in the oxide 230b and the metal oxide 245, and the insulator 250 and the conductor 260 are positioned to be embedded in the opening.

The description of <Structure example 1 of semiconductor device> can be referred to for the other functions and effects.

<Application Example of Semiconductor Device>

Figure 2A:
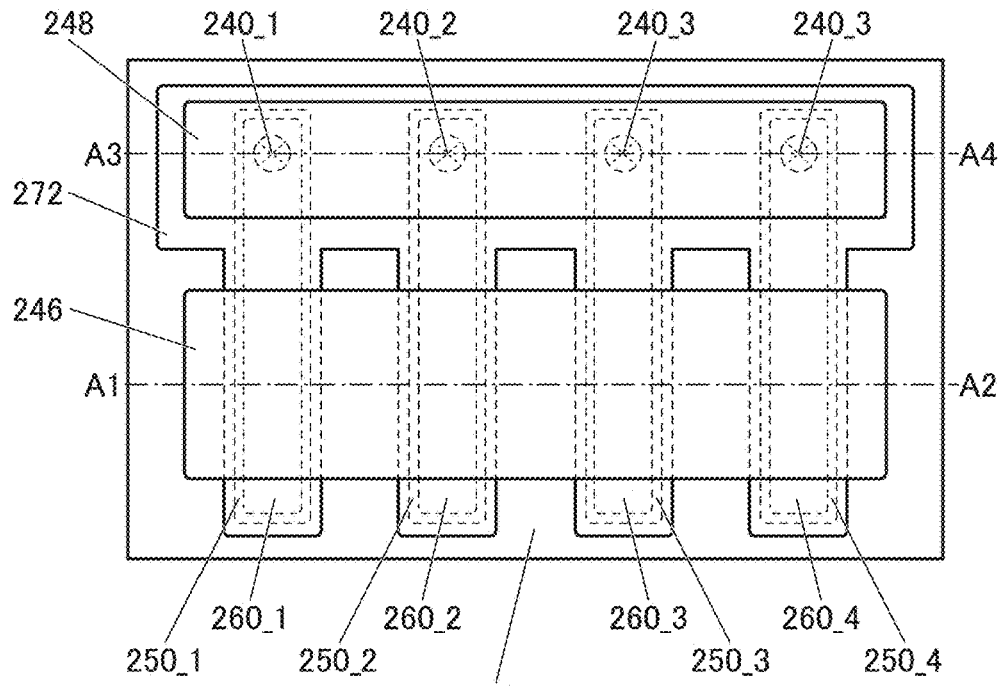
FIG. 2A is a top view of a semiconductor device of one embodiment of the present invention.
Figure 2B:
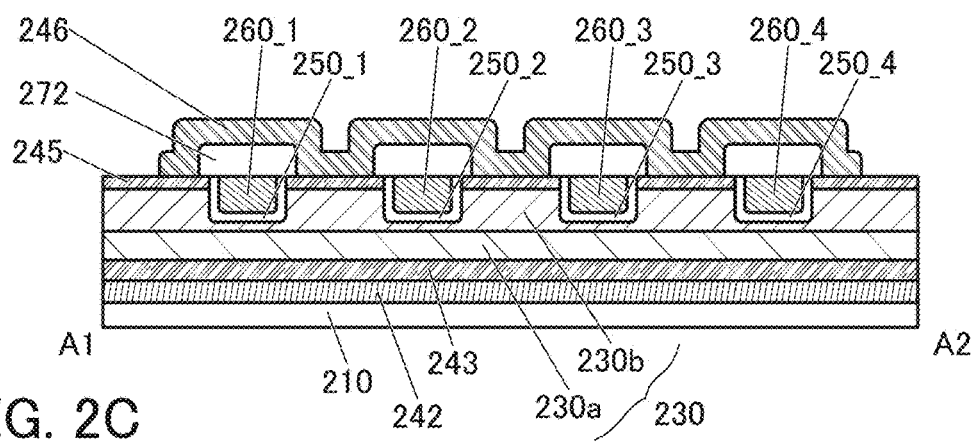
FIG. 2B and FIG. 2C are cross-sectional views of the semiconductor device of one embodiment of the present invention.
Figure 2C:
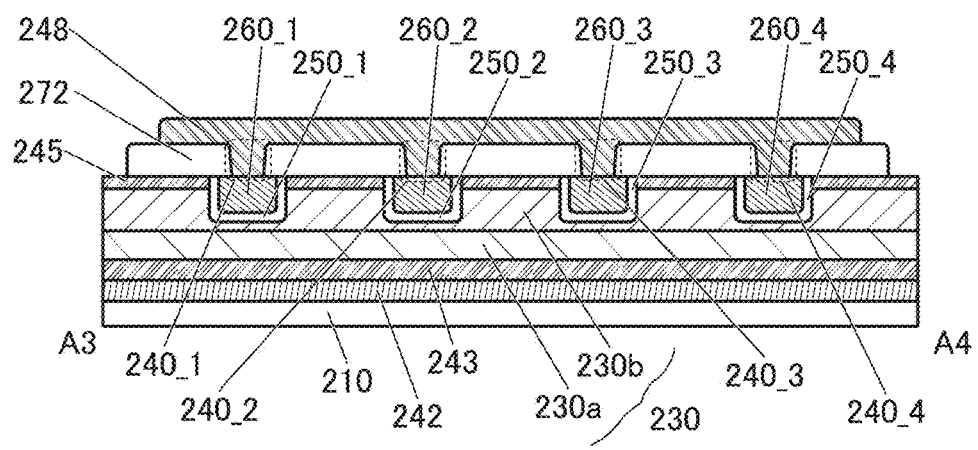

A semiconductor device illustrated in FIG. 2A to FIG. 2C is an application example of the semiconductor device illustrated in FIG. 1B. FIG. 2A is a top view. FIG. 2B is a cross-sectional view corresponding to a portion indicated by dashed-dotted line A1-A2 in FIG. 2A. FIG. 2C is a cross-sectional view corresponding to a portion indicated by dashed-dotted line A3-A4 in FIG. 2A. Note that for clarity of the drawing, some components are not illustrated in the top view of FIG. 2A.

The semiconductor device illustrated in FIG. 2A to FIG. 2C has a structure in which a plurality of transistors 200 included in the semiconductor device illustrated in FIG. 1B are arranged in parallel. As illustrated in FIG. 2A to FIG. 2C, the semiconductor device including the plurality of transistors 200 includes the conductor 242 over the substrate 210, the metal oxide 243 over the conductor 242, the oxide 230$a$ over the metal oxide 243, the oxide 230$b$ over the oxide 230$a$, the insulator 250 (an insulator 250_1 to an insulator 250_4) over the oxide 230$b$, the conductor 260 (a conductor 260_1 to a conductor 260_4) over the insulator 250, the metal oxide 245 over the oxide 230$b$, the insulator 272 over the metal oxide 245, and the conductor 246 over the metal oxide 245 and the insulator 272. The oxide 230$b$ and the metal oxide 245 have openings, and the insulator 250 is positioned in contact with a side portion and a bottom portion of each of the openings. The conductor 260 is positioned such that the bottom portion of the conductor 260 and the side surface of the conductor 260 are in contact with the insulator 250. The conductor 260 includes a region overlapping with the oxide 230$b$, the conductor 246 includes a region in contact with the metal oxide 245, and the metal oxide 245 includes a region in contact with the oxide 230$b$. As illustrated in FIG. 2A and FIG. 2C, the insulator 272 includes an opening 240 (an opening 240_1 to an opening 240_4), and a conductor 248 in contact with the conductor 260 is provided in the opening 240. Note that the conductor 248 can be formed in the same layer at the same time as the conductor 246, whereby the conductor 248 and the conductor 246 can be formed using the same conductor material. In this case, for the conductor 248, a conductor material that can be used for the conductor 246 can be used.

The semiconductor device illustrated in FIG. 2A to FIG. 2C includes the conductor 260_1 to the conductor 260_4 each functioning as a gate, and the insulator 250_1 to the insulator 250_4 each functioning as a gate insulator. Accordingly, in this semiconductor device, four transistors 200 described in <Structure example 2 of semiconductor device> are arranged in parallel. The conductor 248 is electrically connected to the conductor 260_1 to the conductor 260_4 each functioning as a gate through the respective openings included in the insulator 272. Thus, when a potential is applied to the conductor 248, the same potential can be simultaneously applied to the conductor 260_1 to the conductor 260_4, so that all transistors can be turned on. In other words, a path where a channel flows is formed in each of the four transistors, whereby a large amount of on-state current can flow in this semiconductor device.

Note that this semiconductor device shows an example of the structure where the four transistors are arranged in parallel; however, the number of transistors arranged in parallel is not limited thereto. Thus, the number of locations where the transistors are provided can be increased or decreased as appropriate in accordance with the required specification of the semiconductor device.

<Method for Manufacturing Semiconductor Device>

Next, a method for manufacturing the semiconductor device of one embodiment of the present invention illustrated in FIG. 2A to FIG. 2C is described with reference to FIG. 3A to FIG. 8C.

In FIG. 3A to FIG. 8C, A of each drawing is a top view. Moreover, B of each drawing is a cross-sectional view corresponding to a portion indicated by dashed-dotted line A1-A2 in each A. Furthermore, C of each drawing is a cross-sectional view corresponding to a portion indicated by dashed-dotted line A3-A4 in each A. Note that for clarity of the drawing, some components are not illustrated in the top view of A of each drawing.

Figure 3A:
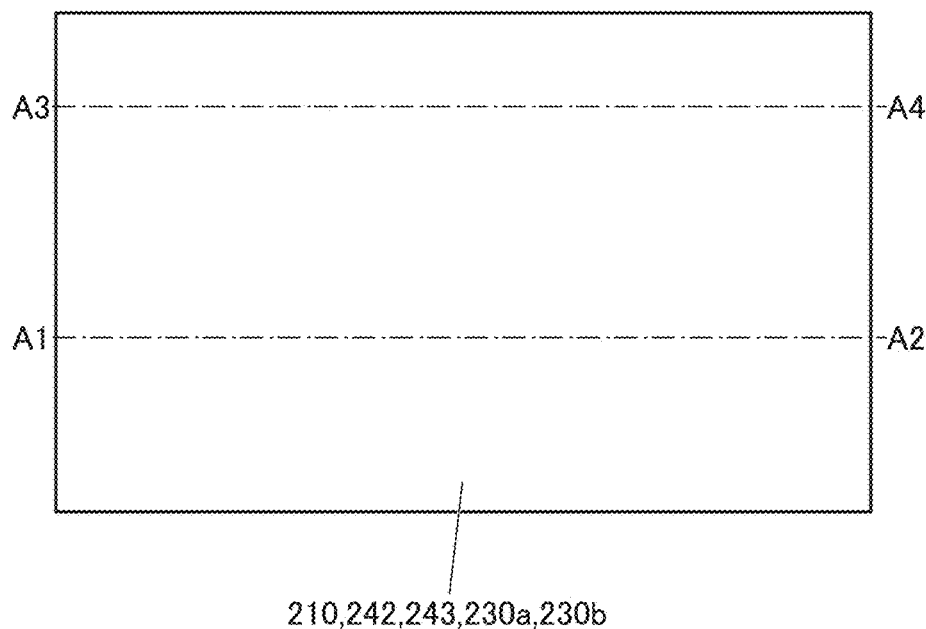
FIG. 3A is a top view illustrating a method for manufacturing a semiconductor device of one embodiment of the present invention.
Figure 3B:
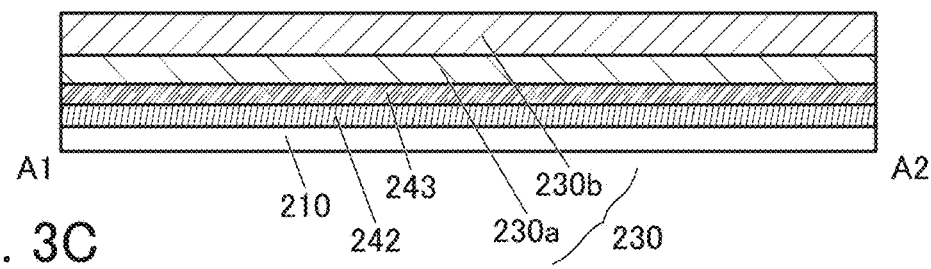
FIG. 3B and FIG. 3C are cross-sectional views illustrating the method for manufacturing a semiconductor device of one embodiment of the present invention.
Figure 3C:
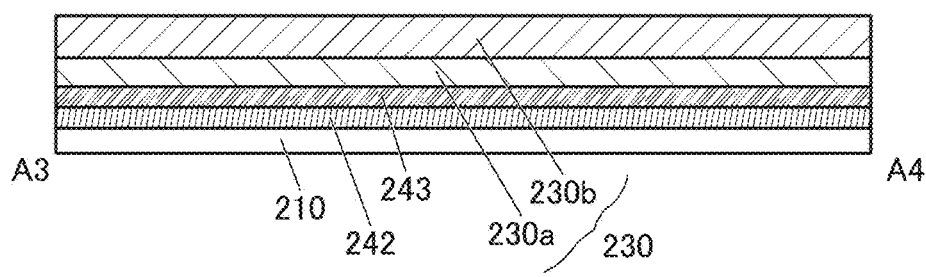

First, the substrate 210 is prepared, and the conductor 242 is deposited over the substrate (see FIG. 3A to FIG. 3C). The conductor 242 can be deposited by, for example, a sputtering method, a CVD method, a molecular beam epitaxy (MBE) method, a pulsed laser deposition (PLD) method, or an atomic layer deposition (ALD) method.

Note that the CVD method can be classified into a plasma enhanced CVD (PECVD) method using plasma, a thermal CVD (TCVD) method using heat, and a photo CVD method using light, for example. Moreover, the CVD method can be classified into a metal CVD (MCVD) method and a metal organic CVD (MOCVD) method depending on a source gas to be used.

A plasma CVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, in the case of a thermal CVD method not using plasma, such plasma damage is not caused and the yield of the semiconductor device can be increased. Furthermore, a film with few defects can be obtained with a thermal CVD method because plasma damage during deposition is not caused.

As an ALD method, for example, a thermal ALD method, in which a precursor and a reactant react with each other only by thermal energy, and a PEALD (Plasma Enhanced ALD) method, in which a plasma-enhanced reactant, is used can be used.

In an ALD method, one atomic layer can be deposited at a time using self-regulating characteristics of atoms. Thus, the ALD method has advantages such as deposition of an extremely thin film, deposition on a component with a high aspect ratio, deposition of a film with few defects such as pinholes, deposition with good coverage, and low-temperature deposition. The use of plasma in a PEALD (Plasma Enhanced ALD) method is sometimes preferable because deposition at a lower temperature is possible. Note that a precursor used in an ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable good step coverage almost regardless of the shape of an object. In particular, an ALD method has excellent step coverage and excellent thickness uniformity and thus is suitable for covering a surface of an opening portion with a high aspect ratio, for example. Note that an ALD method has a relatively low deposition rate; hence, in some cases, an ALD method is preferably combined with another deposition method with a high deposition rate, such as a CVD method.

A CVD method and an ALD method enable control of the composition of a film to be deposited with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where a film is deposited while the flow rate ratio of the source gases is changed, as compared to the case where a film is deposited using a plurality of deposition chambers, the time taken for the deposition can be shortened because the time taken for transfer and pressure adjustment is omitted. Consequently, the productivity of the semiconductor device can be increased in some cases.

In this embodiment, tantalum nitride or tungsten is deposited by a sputtering method as the conductor 242.

Next, the metal oxide 243 is deposited over the conductor 242 (see FIG. 3A to FIG. 3C). The metal oxide 243 can be deposited by, for example, a sputtering method, a CVD method, an MBE method, a PLD method, or an ALD method. In this embodiment, indium tin oxide is deposited by a sputtering method as the metal oxide 243.

Next, the oxide 230a and the oxide 230b are deposited in this order over the metal oxide 243 (see FIG. 3A to FIG. 3C).

The oxide 230a and the oxide 230b can be deposited by, for example, a sputtering method, a CVD method, an MBE method, a PLD method, or an ALD method.

In the case where the oxide 230a and the oxide 230b are deposited by a sputtering method, oxygen or a mixed gas of oxygen and a rare gas is used as a sputtering gas. An increase in the proportion of oxygen contained in the sputtering gas can increase the amount of excess oxygen in the oxide film to be deposited. In the case where the oxide films are deposited by a sputtering method, the above In-M-Zn oxide target or the like can be used.

In the case where the oxide 230a and the oxide 230b are formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. A transistor using an oxygen-excess oxide semiconductor in a channel formation region can have relatively high reliability. However, one embodiment of the present invention is not limited thereto. Furthermore, when the deposition is performed while the substrate is being heated, the crystallinity of the oxide film can be improved. Furthermore, the carrier concentration of the oxide 230b is preferably lower than the carrier concentration of the oxide 230a.

Here, in this embodiment, the oxide 230a is deposited by a sputtering method using an oxide target with In:Ga:Zn=4:2:4.1 [atomic ratio]. In addition, the oxide 230b is deposited by a sputtering method using an oxide target with In:Ga:Zn=1:3:4 [atomic ratio]. Note that each of the oxide 230a and the oxide 230b is preferably formed to have respective required characteristics by selecting the deposition conditions and the atomic ratios as appropriate.

Note that the conductor 242, the metal oxide 243, the oxide 230a, and the oxide 230b are preferably deposited successively without being exposed to the atmospheric environment. The deposition without exposure to the atmospheric environment can prevent impurities or moisture from the atmospheric environment from being attached onto the conductor 242, the metal oxide 243, the oxide 230a, and the oxide 230b and keep cleanliness of the interface between the conductor 242 and the metal oxide 243 and its vicinity, the interface between the metal oxide 243 and the oxide 230a and its vicinity, and the interface between the oxide 230a and the oxide 230b and its vicinity, which is preferable. For the successive deposition, a multi-chamber deposition apparatus is used, for example. The successive deposition is preferable because the process time for manufacturing a semiconductor device can be shortened.

Next, after the deposition of the oxide 230a and the oxide 230b, heat treatment is preferably performed. The heat treatment is performed in a temperature range where the oxide 230a and the oxide 230b do not become polycrystalline, i.e., at a temperature higher than or equal to 250° C. and lower than or equal to 650° C., preferably higher than or equal to 400° C. and lower than or equal to 600° C. The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the oxide 230a, the oxide 230b, and the like as much as possible.

In this embodiment, the heat treatment is performed in such a manner that treatment is performed at 550° C. in a nitrogen atmosphere for one hour, and then another treatment is successively performed at 550° C. in an oxygen atmosphere for one hour. By the heat treatment, impurities such as water and hydrogen in the oxide 230a and the oxide 230b can be removed, for example. Furthermore, the heat treatment improves the crystallinity of the oxide 230b, thereby offering a dense structure with higher density. Thus, diffusion of oxygen or impurities in the oxide 230b can be reduced.

Figure 4A:
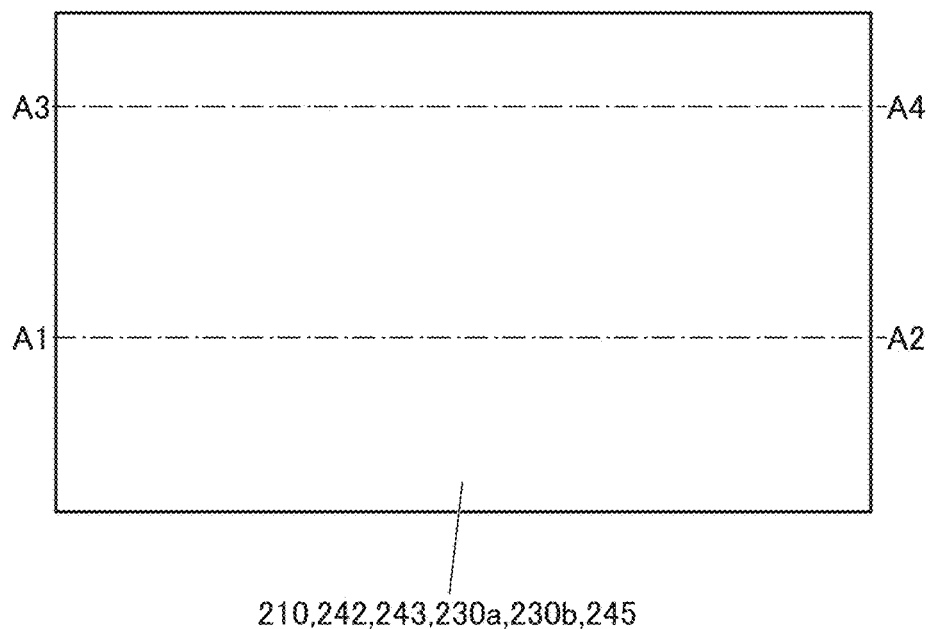
FIG. 4A is a top view illustrating the method for manufacturing a semiconductor device of one embodiment of the present invention.
Figure 4B:
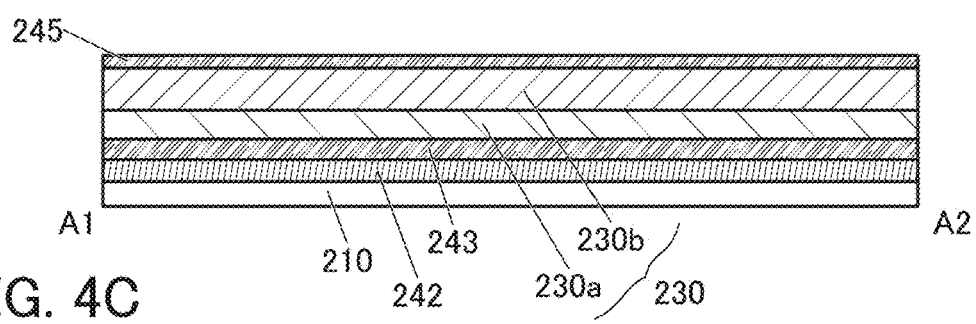
FIG. 4B and FIG. 4C are cross-sectional views illustrating the method for manufacturing a semiconductor device of one embodiment of the present invention.
Figure 4C:
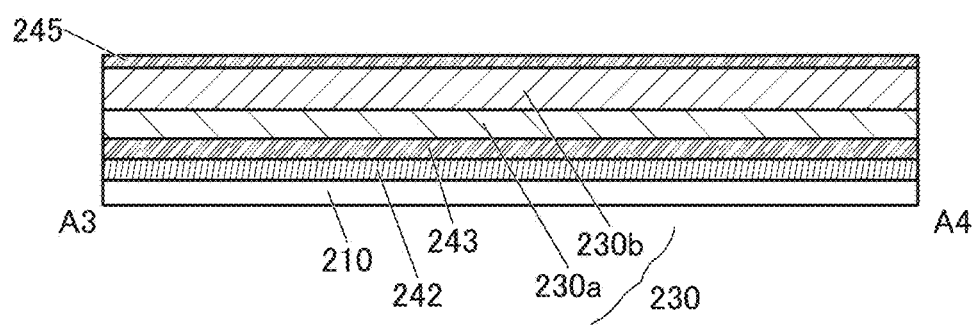
Figure 5A:
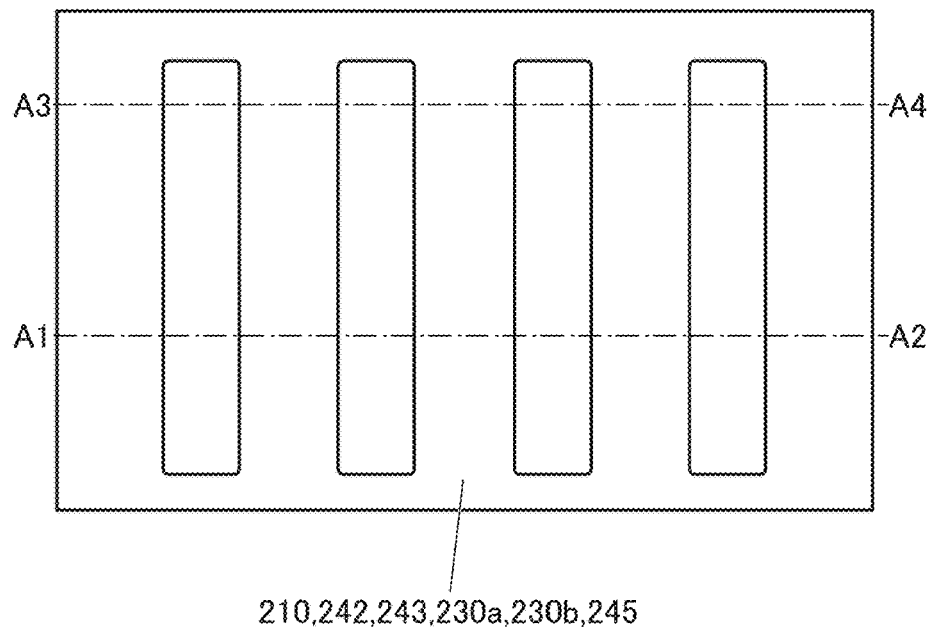
FIG. 5A is a top view illustrating the method for manufacturing a semiconductor device of one embodiment of the present invention.
Figure 5B:
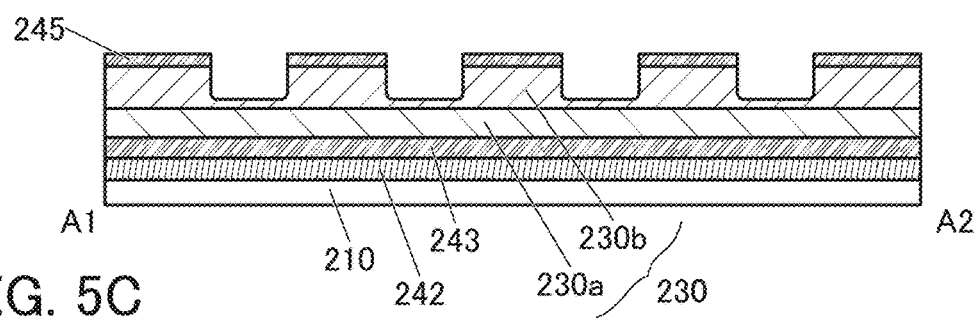
FIG. 5B and FIG. 5C are cross-sectional views illustrating the method for manufacturing a semiconductor device of one embodiment of the present invention.
Figure 5C:
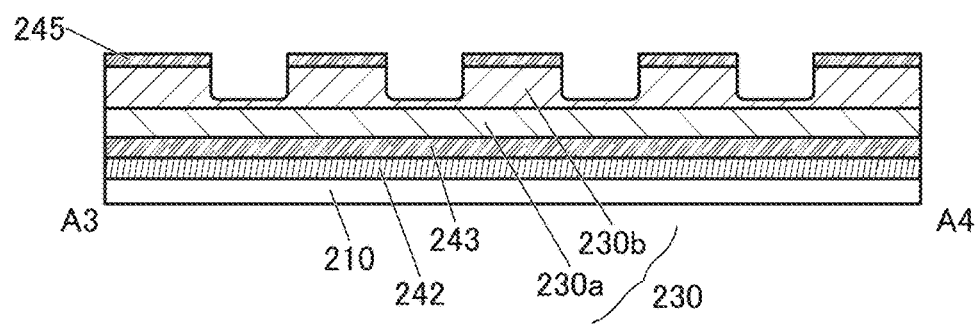

Next, the metal oxide 245 is deposited over the oxide 230b (see FIG. 4A to FIG. 4C). The metal oxide 245 can be deposited by, for example, a sputtering method, a CVD method, an MBE method, a PLD method, or an ALD method. In this embodiment, indium tin oxide is deposited by a sputtering method as the metal oxide 245.

Next, part of the metal oxide 245 and part of the oxide 230b are etched by a lithography method. Note that for the etching of the oxide 230b, 50% to 80% of the thickness of the oxide 230b is preferably etched. In this manner, openings are formed in the metal oxide 245 and the oxide 230b (see FIG. 5A to FIG. 5C).

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used under the resist mask. In the case where a hard mask is used, a hard mask with a desired shape can be formed in the following manner: an insulating film or a conductive film that is the hard mask material is formed over the metal oxide 245, a resist mask is formed thereover, and then the hard mask material is etched. The etching of the metal oxide 245 and the oxide 230b may be performed after removal of the resist mask or while the resist mask remains. In the latter case, the resist mask sometimes disappears during the etching. The hard mask may be removed by etching after the etching of the metal oxide 245 and the oxide 230b. Meanwhile, the hard mask is not necessarily removed when the hard mask material does not affect later steps or can be utilized in later steps.

Figure 6A:
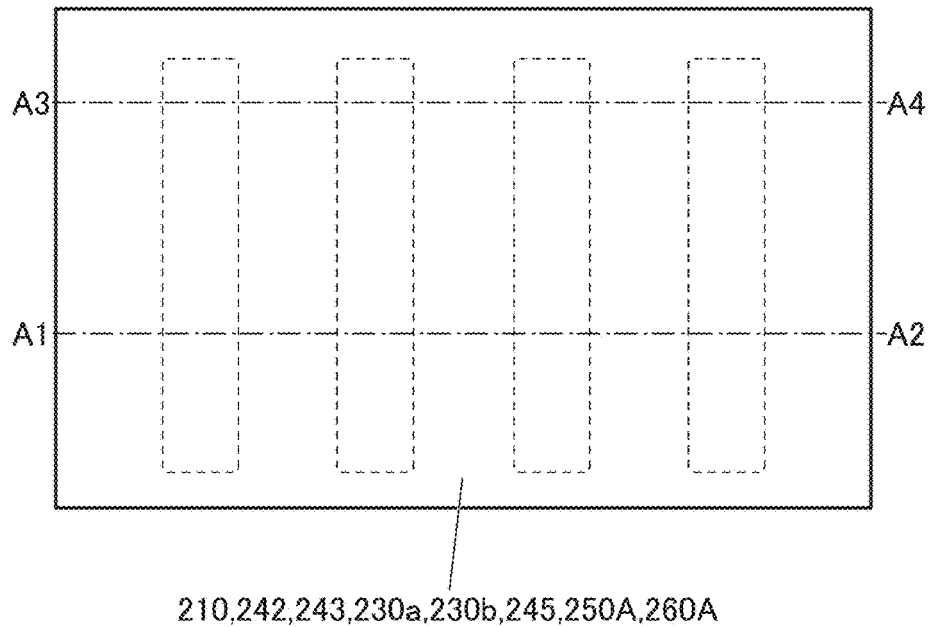
FIG. 6A is a top view illustrating the method for manufacturing a semiconductor device of one embodiment of the present invention.
Figure 6B:
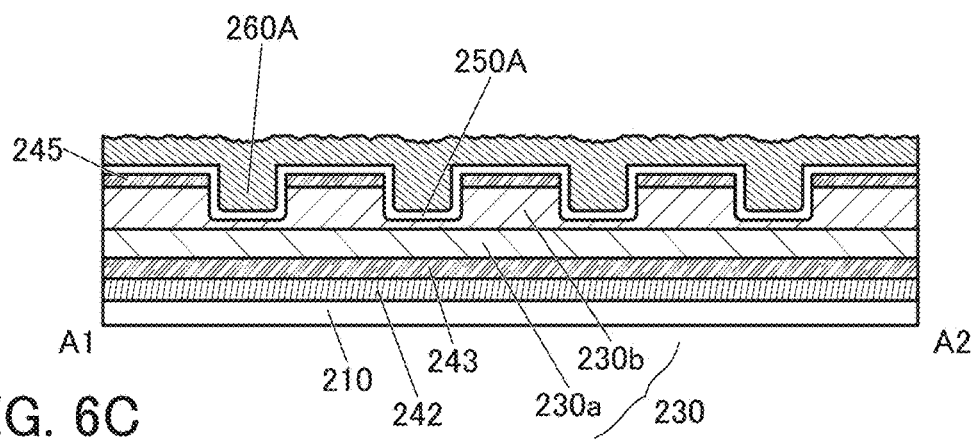
FIG. 6B and FIG. 6C are cross-sectional views illustrating the method for manufacturing a semiconductor device of one embodiment of the present invention.
Figure 6C:
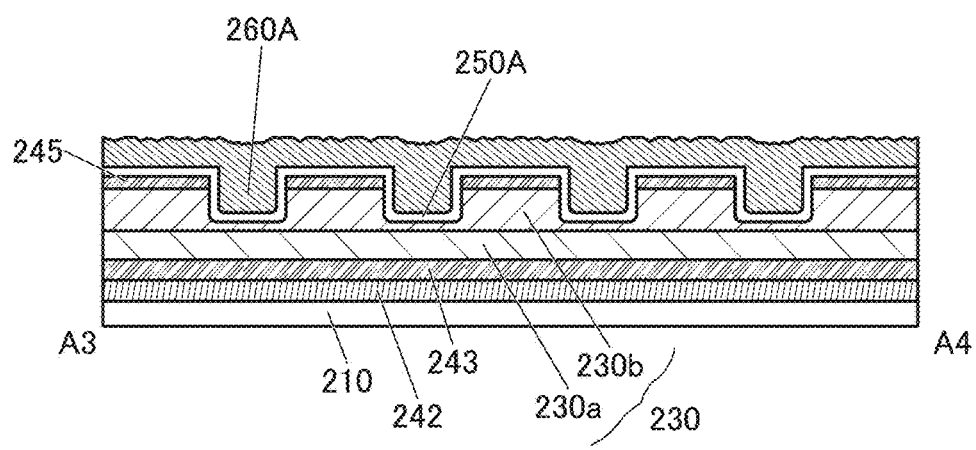

Next, an insulating film 250A is deposited (see FIG. 6A to FIG. 6C). Heat treatment may be performed before the insulating film 250A is deposited; the heat treatment may be performed under reduced pressure, and the insulating film 250A may be deposited successively without exposure to the air. The heat treatment is preferably performed in an oxygen-containing atmosphere. Such treatment can remove moisture and hydrogen adsorbed on a surface of the metal oxide 245, the surface of the oxide 230b, or the like and can reduce the moisture concentration and the hydrogen concentration of the oxide 230a and the oxide 230b. The temperature of the heat treatment is preferably higher than or equal to 100° C. and lower than or equal to 400° C.

The insulating film 250A can be deposited by, for example, a sputtering method, a CVD method, an MBE method, a PLD method, or an ALD method. The insulating film 250A is preferably deposited by a deposition method using the gas in which hydrogen atoms are reduced or removed. Thus, the hydrogen concentration of the insulating film 250A can be reduced.

Note that in the case where the insulator 250 has a two-layer stacked structure, an insulating film to be the lower layer of the insulator 250 and an insulating film to be the upper layer of the insulator 250 are preferably deposited successively without being exposed to the atmospheric environment. When the deposition is performed without exposure to the air, the impurities or moisture from the atmospheric environment can be prevented from being attached onto the insulating film to be the lower layer of the insulator 250 and the insulating film to be the upper layer of the insulator 250, whereby the vicinity of the interface between the insulating film to be the lower layer of the insulator 250 and the insulating film to be the upper layer of the insulator 250 can be kept clean.

Here, after the insulating film 250A is deposited, microwave treatment may be performed in an atmosphere containing oxygen under reduced pressure. By performing the microwave treatment, an electric field from a microwave can be supplied to the insulating film 250A, the oxide 230b, the oxide 230a, and the like, so that VoH in the oxide 230b and the oxide 230a can be divided into Vo and hydrogen. Part of hydrogen divided at this time is bonded to oxygen and is removed as $H_2O$ from the insulating film 250A, the oxide 230b, and the oxide 230a in some cases. Performing the microwave treatment in such a manner can reduce the hydrogen concentration in the insulating film 250A, the oxide 230b, and the oxide 230a. Furthermore, oxygen is supplied to Vo that can exist after VoH in the oxide 230a and the oxide 230b is divided into Vo and hydrogen, so that Vo can be repaired or filled.

After the microwave treatment, heat treatment may be performed with the reduced pressure being maintained. Such treatment enables hydrogen in the insulating film 250A, the oxide 230b, and the oxide 230a to be removed efficiently. Alternatively, it is possible to repeat the step of performing microwave treatment and the step of performing heat treatment with the reduced pressure being maintained after the microwave treatment. The repetition of the heat treatment enables hydrogen in the insulating film 250A, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, whereby diffusion of hydrogen, water, impurities, and the like can be inhibited. Accordingly, hydrogen, water, impurities, and the like can be inhibited from diffusing into the oxide 230b, the oxide 230a, and the like through the insulator 250 in the following step such as deposition of a conductive film to be the conductor 260 or the following treatment such as heat treatment.

Next, a conductive film 260A is deposited (see FIG. 6A to FIG. 6C). The conductive film 260A can be deposited by, for example, a sputtering method, a CVD method, an MBE method, a PLD method, or an ALD method.

Figure 7A:
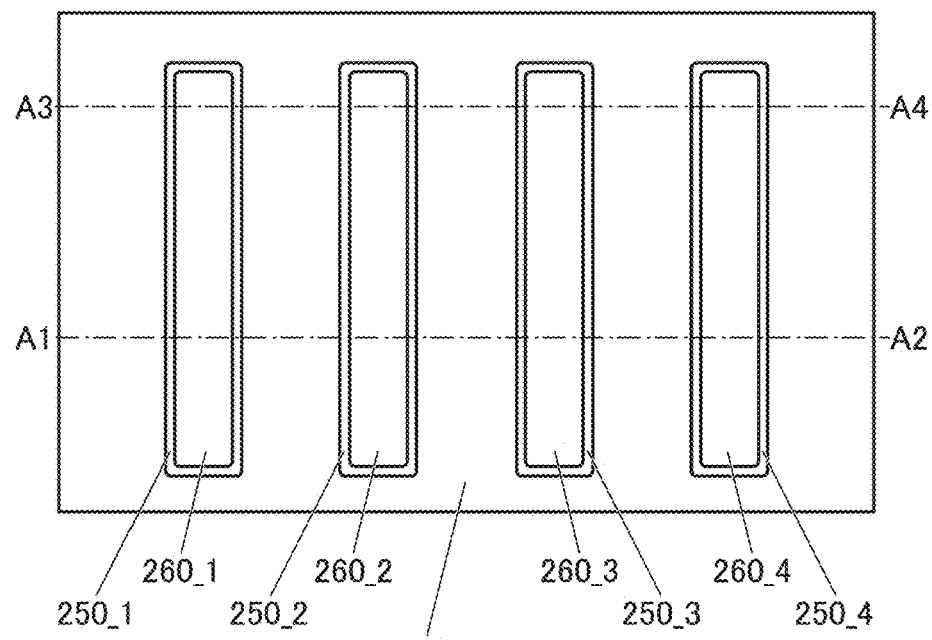
FIG. 7A is a top view illustrating the method for manufacturing a semiconductor device of one embodiment of the present invention.
Figure 7B:
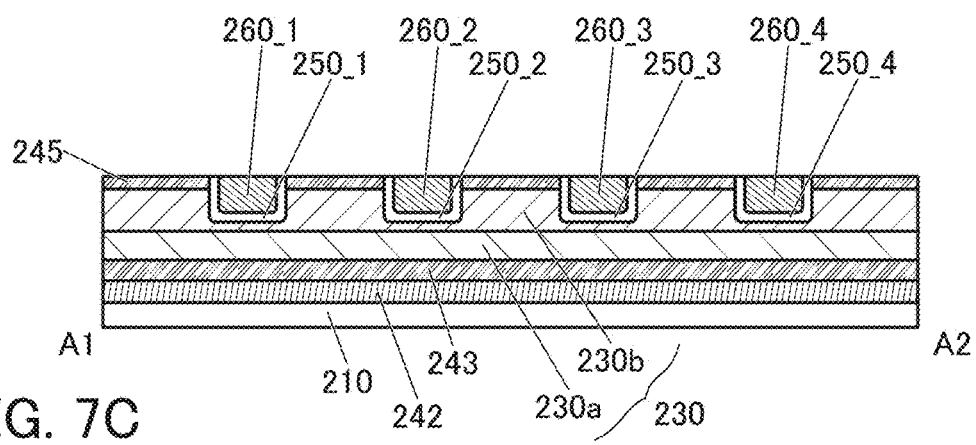
FIG. 7B and FIG. 7C are cross-sectional views illustrating the method for manufacturing a semiconductor device of one embodiment of the present invention.
Figure 7C:
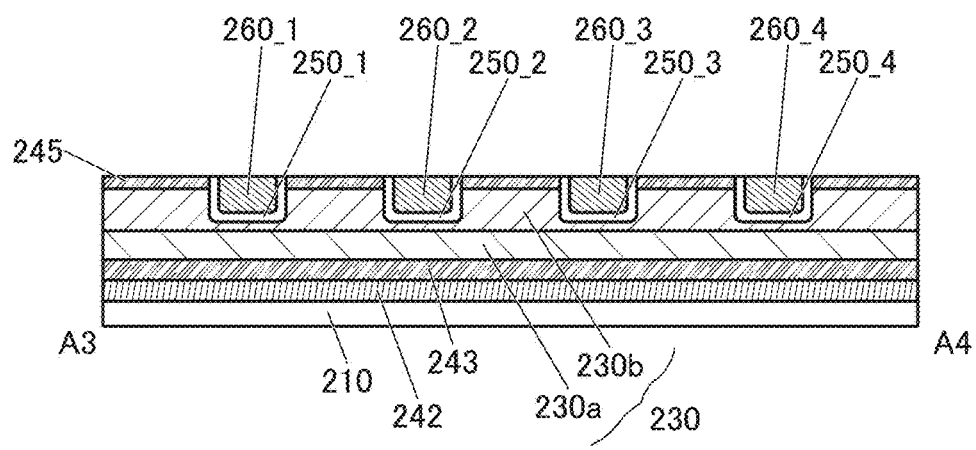
Figure 8A:
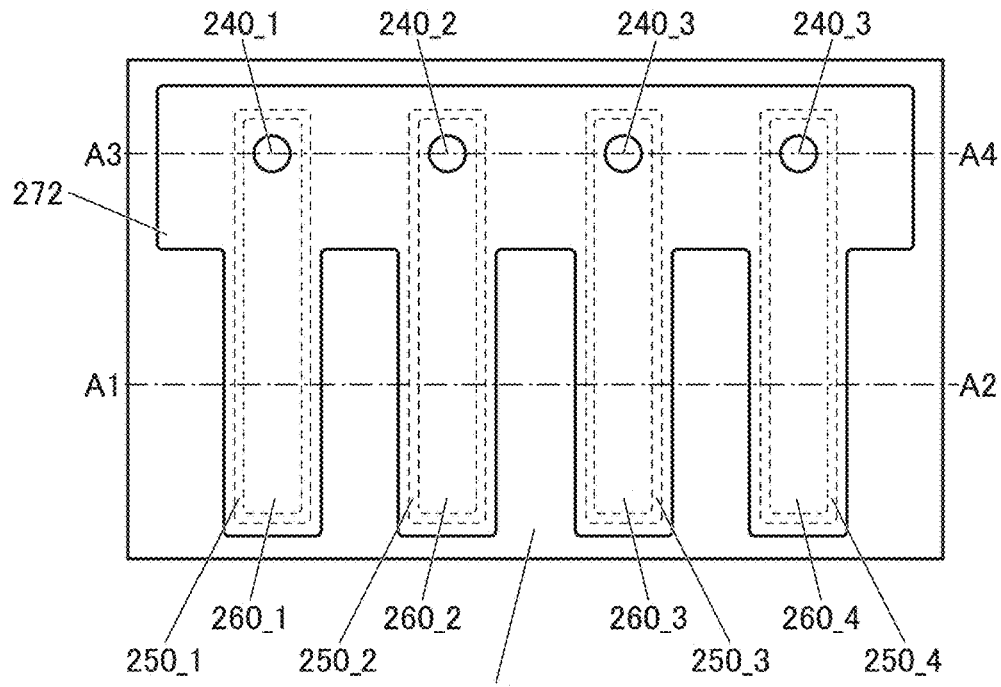
FIG. 8A is a top view illustrating the method for manufacturing a semiconductor device of one embodiment of the present invention.
Figure 8B:
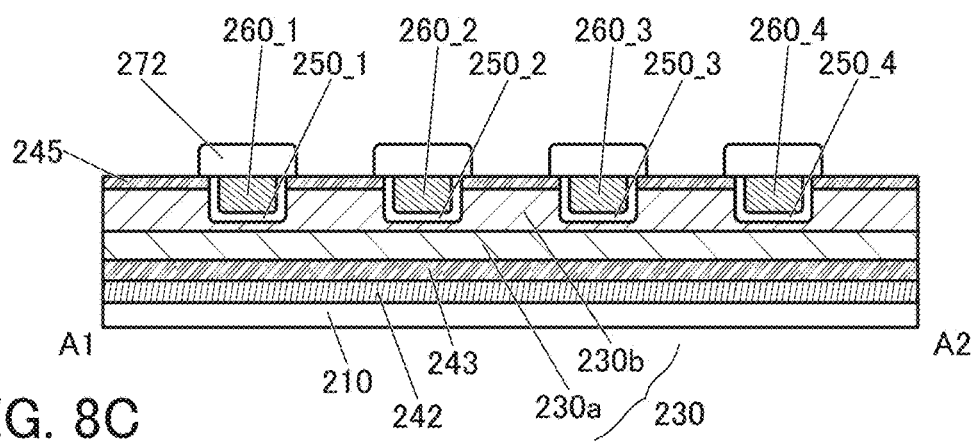
FIG. 8B and FIG. 8C are cross-sectional views illustrating the method for manufacturing a semiconductor device of one embodiment of the present invention.
Figure 8C:
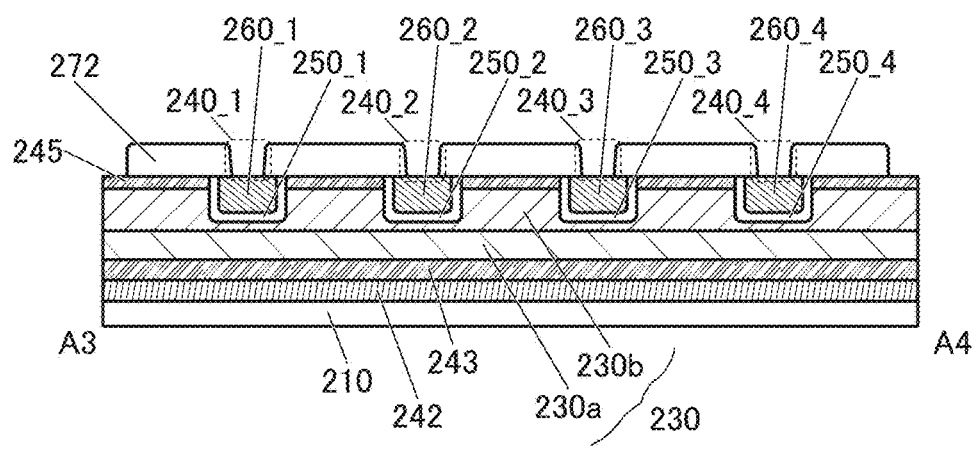

Next, the insulating film 250A and the conductive film 260A are polished by a CMP treatment until the metal oxide 245 is exposed, whereby the insulator 250 (the insulator 250_1, the insulator 250_2, the insulator 250_3, and the insulator 250_4) and the conductor 260 (the conductor 260_1, the conductor 260_2, the conductor 260_3, and the conductor 260_4) are formed (see FIG. 7A to FIG. 7C). Thus, the insulator 250 is positioned to cover an inner wall (a side wall and a bottom surface) of each of the openings. The conductor 260 is positioned to fill the openings with the insulator 250 therebetween.

Next, an insulating film to be the insulator 272 is deposited over the metal oxide 245, the insulator 250, and the conductor 260. The insulating film to be the insulator 272 can be deposited by, for example, a sputtering method, a CVD method, an MBE method, a PLD method, or an ALD method.

Next, the insulating film to be the insulator 272 is processed by a lithography method to form the insulator 272. Note that the insulator 272 includes the opening 240 (the opening 240_1, the opening 240_2, the opening 240_3, and the opening 240_4) reaching the conductor 260 (see FIG. 8A to FIG. 8C). A dry etching method or a wet etching method can be used for the processing of the insulating film to be the insulator 272.

Next, a conductive film to be the conductor 246 and the conductor 248 is deposited. The conductive film to be the conductor 246 and the conductor 248 can be deposited by, for example, a sputtering method, a CVD method, an MBE method, a PLD method, or an ALD method.

Next, the conductive film to be the conductor 246 and the conductor 248 is processed by a lithography method to form the conductor 246 and the conductor 248 (see FIG. 2A to FIG. 2C). A dry etching method or a wet etching method can be used for the processing of the conductive film to be the conductor 246 and the conductor 248.

As illustrated in FIG. 2A and FIG. 2B, the conductor 246 is formed to have a region in contact with the metal oxide 245, and the conductor 246 and the metal oxide 245 are electrically connected. As illustrated in FIG. 2A and FIG. 2C, the conductor 248 is formed to have a region in contact with the conductor 260 through the opening 240, and the conductor 248 and the conductor 260 are electrically connected to each other.

Through the above process, the semiconductor device including the transistor 200 illustrated in FIG. 2A to FIG. 2C can be manufactured.

The structure, method, and the like described in this embodiment can be used in a combination as appropriate with the structures, the methods, and the like described in the other embodiments and the example.

Embodiment 2

In this embodiment, an apparatus that can be used to manufacture the semiconductor device of one embodiment of the present invention is described with reference to FIG. 10.

In manufacture of the semiconductor device of one embodiment of the present invention, it is preferable to use what is called a multi-chamber apparatus including a plurality of treatment chambers enabling successive deposition of different kinds of films. In each treatment chamber, deposition treatment such as sputtering, CVD, or ALD can be performed. For example, in the case where one treatment chamber is a sputtering chamber, a gas supply device, a gas refining device connected to the gas supply device, a vacuum pump, a target, or the like can be connected to the sputtering chamber.

In each treatment chamber, the substrate may be subjected to cleaning treatment, plasma treatment, reverse sputtering treatment, etching treatment, ashing treatment, heat treatment, or the like. Different treatments are performed between treatment chambers as appropriate, whereby an insulator, a conductor, and a semiconductor film can be deposited without being exposed to the air.

A typical example of the semiconductor film used in one embodiment of the present invention includes an oxide semiconductor film. In particular, an oxide semiconductor film having a low impurity concentration and a low density of defect states (a small amount of oxygen vacancies) enables a transistor with excellent electric characteristics to be manufactured. Here, the state in which the impurity concentration is low and the density of defect states is low is referred to as highly purified intrinsic or substantially highly purified intrinsic.

A highly purified intrinsic or substantially highly purified intrinsic oxide semiconductor film has few carrier generation sources, and thus the carrier density can be reduced. Thus, a transistor in which a channel formation region is formed in the oxide semiconductor film rarely has electrical characteristics in which the threshold voltage is negative (also referred to as normally on). In addition, a highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has an extremely low off-state current; even when an element has a channel width of $1 \times 10^6$ µm and a channel length L of 10 µm, the off-state current can be less than or equal to the measurement limit of a semiconductor parameter analyzer, i.e., less than or equal to $1 \times 10^{-13}$ A, at a voltage between a source electrode and a drain electrode (drain voltage) ranging from 1 V to 10 V.

Note that impurities in the oxide semiconductor film are typically water, hydrogen, and the like. In this specification and the like, reducing or removing water and hydrogen from the oxide semiconductor film may be referred to as dehydration or dehydrogenation. Moreover, adding oxygen to the oxide semiconductor film may be referred to as oxygen addition and a state in which oxygen in excess of the stoichiometric composition is contained due to the oxygen addition may be referred to as an oxygen-excess state.

Here, an oxide semiconductor film, an insulator or a conductor below the oxide semiconductor film, and an insulator or a conductor over the oxide semiconductor film are deposited successively with different kinds of materials without being exposed to the air, whereby a substantially highly purified intrinsic oxide semiconductor film whose impurity (particularly hydrogen and water) concentration is reduced can be formed.

First, a structure example of an apparatus that can be used to manufacture the semiconductor device of one embodiment of the present invention is described with reference to FIG. 10. With the use of the apparatus illustrated in FIG. 10, it is possible to successively deposit a semiconductor film, an insulator or a conductor positioned below the semiconductor film, and an insulator or a conductor positioned over the semiconductor film. Thus, entry of impurities (particularly hydrogen and water) into the semiconductor film can be inhibited.

Figure 10:
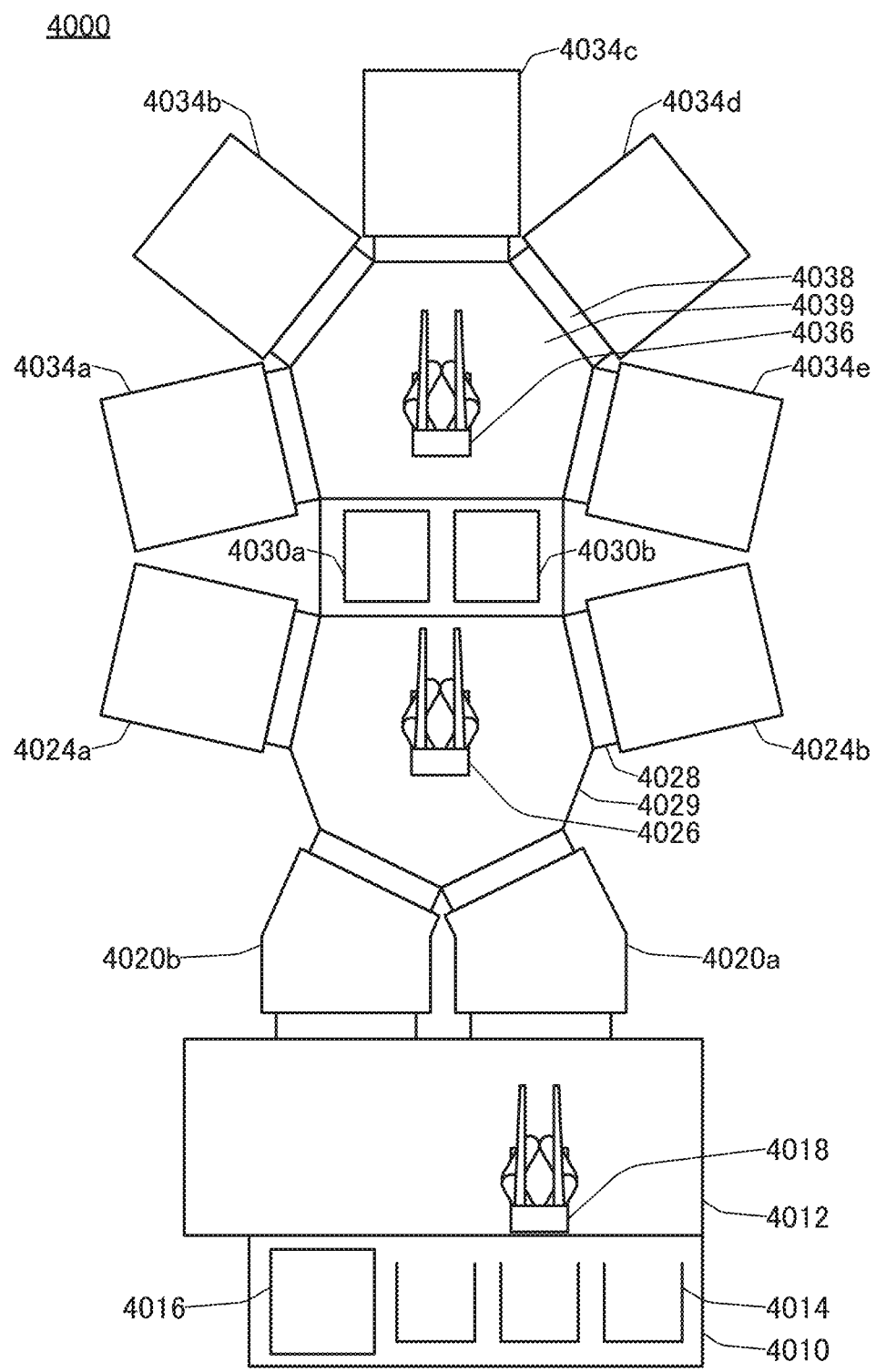
FIG. 10 is a top view illustrating an example of an apparatus for manufacturing a semiconductor device of one embodiment of the present invention.

FIG. 10 schematically shows a top view of a single wafer multi-chamber apparatus 4000.

The apparatus 4000 includes an atmosphere-side substrate supply chamber 4010, an atmosphere-side substrate transfer chamber 4012 that transfers a substrate from the atmosphere-side substrate supply chamber 4010, a load lock chamber 4020a that carries the substrate and switches a pressure in the chamber from an atmospheric pressure to a reduced pressure or from a reduced pressure to an atmospheric pressure, an unload lock chamber 4020b that carries a substrate and switches the pressure in the chamber from a reduced pressure to an atmospheric pressure or from an atmospheric pressure to a reduced pressure, a transfer chamber 4029 and a transfer chamber 4039 that transfer a substrate in a vacuum, a delivering chamber 4030a and a delivering chamber 4030b that connect the transfer chamber 4029 and the transfer chamber 4039, and a treatment chamber 4024a, a treatment chamber 4024b, a treatment chamber 4034a, a treatment chamber 4034b, a treatment chamber 4034c, a treatment chamber 4034d, and a treatment chamber 4034e that perform deposition or heating.

Note that different treatments can be performed in a plurality of treatment chambers in parallel. Thus, a stacked structure of different kinds of films can be easily fabricated.

The number of parallel treatments that can be conducted at maximum is equated to the number of treatment chambers. For example, the apparatus 4000 illustrated in FIG. 10 is an apparatus that includes seven treatment chambers. Therefore, seven deposition treatments can be successively performed without being exposed to the air using one apparatus (which is referred to as "in-situ" in this specification).

On the other hand, in the stacked structure, the number of stacked layers which can be formed without being exposed to the air is not necessarily equal to the number of treatment chambers. For example, in the case where a stacked-layer structure to be required includes a plurality of layers formed using the same material, the layers can be provided in one treatment chamber; thus, a stacked-layer structure can have stacked layers the number of which is larger than the number of provided treatment chambers.

The atmosphere-side substrate supply chamber 4010 includes a cassette port 4014 that holds a substrate and an alignment port 4016 that aligns a substrate. Note that a plurality of the cassette ports 4014 may be provided (e.g., in FIG. 10, three cassette ports are provided).

The atmosphere-side substrate transfer chamber 4012 is connected to the load lock chamber 4020a and the unload lock chamber 4020b. The transfer chamber 4029 is connected to the load lock chamber 4020a, the unload lock chamber 4020b, the delivering chamber 4030a, the delivering chamber 4030b, the treatment chamber 4024a, and the treatment chamber 4024b. The delivering chamber 4030a and the delivering chamber 4030b are connected to the transfer chamber 4029 and the transfer chamber 4039. The transfer chamber 4039 is connected to the delivering chamber 4030a, the delivering chamber 4030b, the treatment chamber 4034a, the treatment chamber 4034b, the treatment chamber 4034c, the treatment chamber 4034d, and the treatment chamber 4034e.

Note that a gate valve 4028 or a gate valve 4038 is provided for a connecting portion of each chamber so that each of the chambers except for the atmosphere-side substrate supply chamber 4010 and the atmosphere-side substrate transfer chamber 4012 can be independently kept under vacuum. The atmosphere-side substrate transfer chamber 4012 includes a transfer robot 4018. The transfer chamber 4029 includes a transfer robot 4026, and the transfer chamber 4039 includes a transfer robot 4036. Each of the transfer robot 4018, the transfer robot 4026, and the transfer robot 4036 includes a plurality of movable portions and an arm for holding a substrate and can transfer a substrate to each chamber.

Note that the numbers of transfer chambers, treatment chambers, load lock chambers, unload lock chambers, and delivering chambers are not limited to the above, and can be set as appropriate depending on the space for placement or the process conditions.

In particular, in the case where a plurality of transfer chambers are provided, two or more delivering chambers are preferably provided between one transfer chamber and another transfer chamber. For example, in the case where the transfer chamber 4029 and the transfer chamber 4039 are provided as illustrated in FIG. 10, the delivering chamber 4030a and the delivering chamber 4030b are preferably arranged in parallel between the transfer chamber 4029 and the transfer chamber 4039.

When the delivering chamber 4030a and the delivering chamber 4030b are arranged in parallel to each other, for example, a step of carrying a substrate to the delivering chamber 4030a by the transfer robot 4026 and a step of carrying a substrate to the delivering chamber 4030b by the transfer robot 4036 can be concurrently performed. Furthermore, a step of carrying out a substrate from the delivering chamber 4030b by the transfer robot 4026 and a step of carrying out a substrate from the delivering chamber 4030a by the transfer robot 4036 can be concurrently performed. That is, when a plurality of transfer robots are driven concurrently, the production efficiency is improved.

Although FIG. 10 illustrates an example where one transfer chamber is provided with one transfer robot and connected to a plurality of treatment chambers, one embodiment of the present invention is not limited to the structure. One transfer chamber may be provided with a plurality of transfer robots.

In addition, one or both of the transfer chamber 4029 and the transfer chamber 4039 are connected to a vacuum pump and a cryopump through valves. Accordingly, the transfer chamber 4029 and the transfer chamber 4039 can be evacuated with use of the vacuum pump from the atmospheric pressure to low or medium vacuum (approximately several hundred pascals to 0.1 Pa) and then, by switching the valve, be evacuated with use of the cryopump from the medium vacuum to high or ultra-high vacuum (approximately 0.1 Pa to $1 \times 10^{-7}$ Pa).

Alternatively, two or more cryopumps may be connected in parallel to one transfer chamber, for example. With a plurality of cryopumps, even when one of the cryopumps is in regeneration, exhaust can be performed using the other cryopumps. Note that the above regeneration refers to treatment for discharging molecules (or atoms) entrapped in the cryopump.

When molecules (or atoms) are entrapped too much in a cryopump, the exhaust capability is lowered; therefore, it is preferable to perform regeneration regularly.

The treatment chamber 4024a, the treatment chamber 4024b, the treatment chamber 4034a, the treatment chamber 4034b, the treatment chamber 4034c, the treatment chamber 4034d, and the treatment chamber 4034e can perform different treatments in parallel. In other words, each of the treatment chambers enables a deposition treatment by a sputtering method, a CVD method, an MBE method, a PLD method, an ALD method, or the like, a heat treatment, or a plasma treatment to be performed on the substrate provided. In the treatment chamber, a deposition treatment may be performed after a heat treatment or a plasma treatment.

In the apparatus 4000, it is possible to transfer a substrate without exposure of the substrate to the air between treatments since a plurality of treatment chambers are provided; hence, adsorption of impurities on the substrate can be inhibited. The treatment chambers can perform a deposition treatment for different kinds of films, a heat treatment, or a plasma treatment, which makes it possible to freely determine the order of deposition, a heat treatment, and the like.

Note that each treatment chamber may be connected to the vacuum pump through a valve. As the vacuum pump, a dry pump, a mechanical booster pump, and the like can be used, for example.

Furthermore, each treatment chamber may be connected to a power source capable of generating plasma. As the power source, a DC power source, an AC power source, or a high-frequency (RF, microwave, or the like) power source can be provided. A pulsed generator may be connected to the DC power source.

Moreover, the treatment chamber may be connected to a gas refining device through a gas supply device. Note that the number of provided gas supply devices and the number of provided gas refining devices are preferably the same as the number of kinds of gases.

For example, in the case where the deposition treatment is performed by sputtering in the treatment chamber, the treatment chamber may include a target, a backing plate connected to the target, a cathode positioned to face the target with the backing plate positioned therebetween, a deposition shield, a substrate stage, or the like. For example, the substrate stage may include a substrate holding mechanism which holds the substrate, a rear heater which heats the substrate from the back surface, or the like.

Note that the substrate stage is held substantially perpendicular to a floor during deposition and is held substantially parallel to the floor when the substrate is delivered. Here, when the substrate stage is held substantially perpendicular to the floor, the probability that dust or a particle mixed into the film during deposition is attached to the substrate can be lowered as compared to the case where the substrate stage is held parallel to the floor. However, there is a possibility that the substrate falls when the substrate stage is held perpendicular (90°) to the floor; therefore, the angle of the substrate stage to the floor is preferably greater than or equal to 80° and less than 90°.

Note that the structure of the substrate stage is not limited to the above structure. A structure in which the substrate stage is substantially parallel to the floor may be employed, for example. With that structure, a target is positioned below the substrate stage, and a substrate is positioned between the target and the substrate stage. The substrate stage may be provided with a jig for fixing a substrate so as not to fall or a mechanism for fixing a substrate.

Furthermore, when a deposition shield is provided for the treatment chamber, particles sputtered from the target can be inhibited from being deposited on a region where deposition is not needed. Moreover, the deposition shield is preferably processed to prevent accumulated sputtered particles from being separated. For example, blasting treatment which increases surface roughness or projections and depressions may be provided on the surfaces of the deposition shield.

The backing plate has a function of holding the target. The cathode has a function of applying voltage (e.g., negative voltage) to the target.

Note that the target can be formed using a conductor, an insulator, or a semiconductor. For example, when the target is an oxide semiconductor such as a metal oxide, an oxide semiconductor film can be deposited in the treatment chamber. In addition, when the target is a metal oxide, an oxynitride semiconductor film can be formed by using a nitrogen gas as the deposition gas.

Each treatment chamber may be connected to a gas supply device through a gas heating mechanism. The gas heating mechanism is connected to a gas refining device through the gas supply device. As the gas introduced to the treatment chamber, a gas whose dew point is −80° C. or lower, preferably −100° C. or lower, further preferably −120° C. or lower can be used; for example, an oxygen gas, a nitrogen gas, and a rare gas (e.g., an argon gas) can be used. With the gas heating mechanism, a gas which is introduced to the treatment chamber can be heated to a temperature higher than or equal to 40° C. and lower than or equal to 400° C. Note that the number of provided gas heating mechanisms, the number of provided gas supply devices, and the number of provided gas refining devices are preferably the same as the number of kinds of gases.

Each treatment chamber may be connected to a turbo molecular pump and a vacuum pump through a valve. Each treatment chamber may be provided with a cryotrap.

The cryotrap is a mechanism which can adsorb a molecule (or an atom) having a relatively high melting point, such as water. The turbo molecular pump has excellent productivity because it stably exhausts a large-sized molecule (or atom) and needs low frequency of maintenance, whereas it has a low capability in removing hydrogen and water. Thus, a cryotrap can be used to improve the evacuation capability of water or the like. The temperature of a freezer of the cryotrap is set lower than or equal to 100 K, preferably lower than or equal to 80 K. Furthermore, in the case where the cryotrap has a plurality of freezers, it is preferable to set the freezers at different temperatures because efficient exhaust is possible. For example, the temperature of a first-stage freezer is set lower than or equal to 100 K and the temperature of a second-stage freezer is set lower than or equal to 20 K.

Note that the exhaust method for the treatment chamber is not limited thereto, and a system similar to that in the exhaust method described for the transfer chamber connected thereto (the exhaust method using the cryopump and the vacuum pump) may be employed. Note that the exhaust method for the transfer chamber may have a system similar to that of the treatment chamber (the exhaust method using the turbo molecular pump and the vacuum pump).

In particular, the vacuum pump and the cryotrap may be combined as the exhaust method for the treatment chamber where an oxide semiconductor film is deposited. The exhaust method for the treatment chamber where an oxide semiconductor film is deposited preferably has at least a function of adsorbing water molecules.

In the treatment chamber where the oxide semiconductor film is deposited, the partial pressure of hydrogen molecules is preferably lower than or equal to $1 \times 10^{-2}$ Pa, and the partial pressure of water molecules is preferably lower than or equal to $1 \times 10^{-4}$ Pa. In the treatment chamber where the oxide semiconductor film is deposited in a standby state, the pressure is lower than or equal to $8.0 \times 10^{-5}$ Pa, preferably lower than or equal to $5.0 \times 10^{-5}$ Pa, further preferably lower than or equal to $1.0 \times 10^{-5}$ Pa. The above values of the partial pressure of hydrogen molecules and the partial pressure of water molecules are the values of both of the standby state and in the deposition state (a plasma discharge state) of the sputtering chamber in which sputtering is performed.

Note that a total pressure and a partial pressure in the treatment chamber can be measured using a mass analyzer. For example, Qulee CGM-051, a quadrupole mass analyzer (also referred to as Q-mass) produced by ULVAC, Inc. can be used.

When the partial pressure of hydrogen molecules, the partial pressure of water molecules, and the pressure in a standby state in the treatment chamber are set to the values in above ranges, the impurity concentration in an oxide semiconductor film to be formed can be reduced.

In particular, each treatment chamber is used for deposition treatment by sputtering, so that part of the structure of the transistor 200 described in the above embodiment can be manufactured with a stacked-layer structure by successive in-situ deposition.

In the method for forming the transistor 200, the conductor 242, the metal oxide 243, the oxide 230*a*, and the oxide 230*b* are deposited successively with the apparatus 4000.

That is, the conductor 242, the metal oxide 243, the oxide 230*a*, and the oxide 230*b* can be deposited successively without being exposed to the air.

With the above structure, a stacked film from which impurities (typically, water, hydrogen, and the like) are thoroughly removed can be formed. Furthermore, each interface between the stacked films is not exposed to the air; thus, the impurity concentration is reduced.

Alternatively, in the case where heat treatment is performed in a treatment chamber, for example, the treatment chamber may have a plurality of heating stages that can hold a substrate. Note that the heating stage may have several stages. By increasing the number of heating stages, a plurality of substrates can be subjected to heat treatment at the same time, which leads to an increase in productivity.

Furthermore, a heating mechanism which can be used for the treatment chamber may be a heating mechanism which performs heating with a resistance heater or the like, for example. Alternatively, a heating mechanism that uses heat conduction or heat radiation from a medium such as a heated gas for heating may be used. For example, RTA (Rapid Thermal Anneal) such as a GRTA (Gas Rapid Thermal Anneal) or an LRTA (Lamp Rapid Thermal Anneal) can be used. In the LRTA, an object is heated by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

The load lock chamber 4020a may include a substrate delivery stage, a rear heater for heating a substrate from the back surface, or the like. When a pressure in the load lock chamber 4020a is increased from a reduced pressure state to an atmospheric pressure in the load lock chamber 4020a becomes an atmospheric pressure, the substrate delivery stage receives a substrate from the transfer robot 4018 provided in the atmosphere-side substrate transfer chamber 4012. After that, the load lock chamber 4020a is evacuated into vacuum to make a reduced pressure state, and then the transfer robot 4026 provided in the transfer chamber 4029 receives the substrate from the substrate delivery stage.

Furthermore, the load lock chamber 4020a is connected to the vacuum pump and the cryopump through valve. Note that the unload lock chamber 4020b may have a structure similar to that of the load lock chamber 4020a.

Since the atmosphere-side substrate transfer chamber 4012 includes the transfer robot 4018, delivery and receipt of a substrate between the cassette port 4014 and the load lock chamber 4020a can be performed using the transfer robot 4018. Furthermore, a mechanism for inhibiting entry of dust or a particle, such as an HEPA filter (High Efficiency Particulate Air Filter), may be provided above the atmosphere-side substrate transfer chamber 4012 and the atmosphere-side substrate supply chamber 4010. The cassette port 4014 can hold a plurality of substrates.

Entry of impurities into a semiconductor film can be suitably inhibited when an insulating film, a semiconductor film, and a conductive film are deposited successively without exposure to the air with use of the apparatus 4000 described above.

As described above, a stacked-layer structure including a semiconductor film can be formed by successive film deposition with use of the apparatus of one embodiment of the present invention. Therefore, impurities such as hydrogen, water, or the like that might enter a semiconductor film can be inhibited and a semiconductor film with a low density of defect states can be formed.

The structure, method, and the like described in this embodiment can be used in a combination as appropriate with the structures, the methods, and the like described in the other embodiments and the example.

Embodiment 3

In this embodiment, examples in which the semiconductor device described in the above embodiment are used in an electronic component and examples in which the semiconductor device described in the above embodiment are used in an electronic device including the electronic component are described with reference to FIG. 11 and FIG. 12.

Figure 11A:
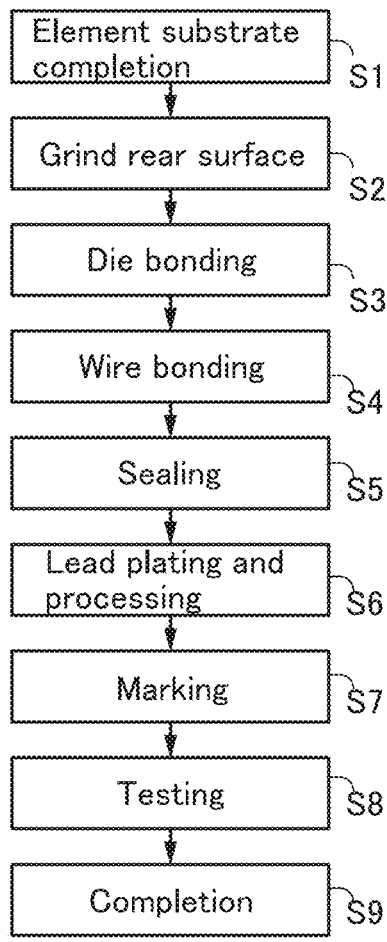
FIG. 11A is a flow chart showing manufacturing steps of a semiconductor device of one embodiment of the present invention.

FIG. 11A illustrates an example in which the semiconductor device described in the above embodiments is used in an electronic component. Note that the electronic component is also referred to as a semiconductor package or an IC package. For the electronic component, there are a plurality of standards and names corresponding to a terminal extraction direction and a terminal shape. Thus, an example thereof is described in this embodiment.

A semiconductor device including the transistor illustrated in FIG. 2A, FIG. 2B, and FIG. 2C in Embodiment 1 described above is completed by integrating a plurality of detachable components on a printed circuit board after an assembly process (post-process).

The post-process can be completed through steps shown in FIG. 11A. Specifically, after an element substrate obtained in a pre-process is completed (Step S1), a rear surface of the substrate is ground (Step S2). The substrate is thinned down at this stage, so that warpage or the like of the substrate in the pre-process is reduced and the size of the component is reduced.

The rear surface of the substrate is ground, and a dicing step is performed to divide the substrate into a plurality of chips. Then, a die bonding step of individually picking up the divided chips to be mounted on and bonded to a lead frame is performed (Step S3). To bond the chip and the lead frame in this die bonding step, a method such as bonding with a resin or bonding with a tape is selected as appropriate depending on products. Note that in the die bonding step, chips may be mounted on and bonded to an interposer.

Next, wire bonding in which a lead of the lead frame and an electrode on the chip are electrically connected with a metal fine line (wire) is performed (Step S4). A silver line or a gold line can be used as the metal fine line. Ball bonding or wedge bonding can be used as the wire bonding.

The wire-bonded chip is subjected to sealing with an epoxy resin or the like in a molding step (Step S5). With the molding step, the inside of the electronic component is filled with a resin, so that damage to the circuit portion and the wire embedded by external mechanical force can be reduced, and degradation in characteristics due to moisture or dust can be reduced.

Next, the lead of the lead frame is subjected to plating treatment. Then, the lead is cut and processed (Step S6). This plating treatment prevents corrosion of the lead and enables more reliable soldering at the time of mounting the electronic component on a printed circuit board in a later step.

Next, printing treatment (marking) is performed on a surface of the package (Step S7). After a final testing step (Step S8), the electronic component is completed (Step S9).

The above-described electronic component can include the semiconductor device described in the above embodiment. Thus, the electronic component including the semiconductor device whose frequency of malfunction in a high-temperature environment and manufacturing cost are reduced can be obtained. Since the electronic component includes the semiconductor device in which the frequency of malfunction in a high-temperature environment is reduced and manufacturing cost is reduced, the restriction of the electronic component on a usage environment is relieved and the size of the electronic component is reduced.

Figure 11B:
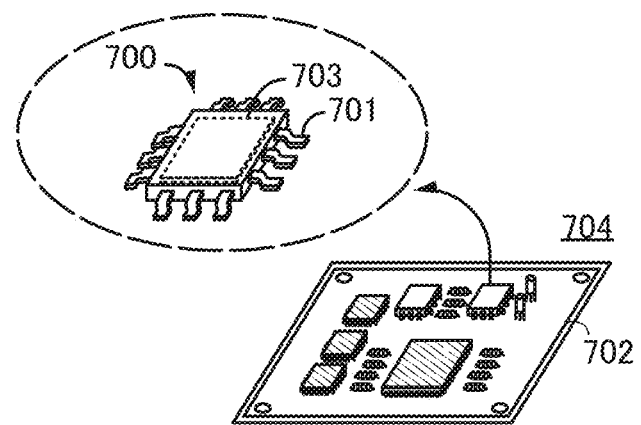
FIG. 11B is a perspective view illustrating a semiconductor device of one embodiment of the present invention.

FIG. 11B is a schematic perspective view of a completed electronic component. FIG. 11B is a schematic perspective view illustrating a QFP (Quad Flat Package) as an example of the electronic component. An electronic component 700 in FIG. 11B includes a lead 701 and a semiconductor device 703. The electronic component 700 illustrated in FIG. 11B is mounted on a printed circuit board 702, for example. A plurality of electronic components 700 are combined and electrically connected to each other over the printed circuit board 702; thus, a board on which the electronic components are mounted (a circuit board 704) is completed. The completed circuit board 704 is provided in an electronic device or the like.

Figure 12A:
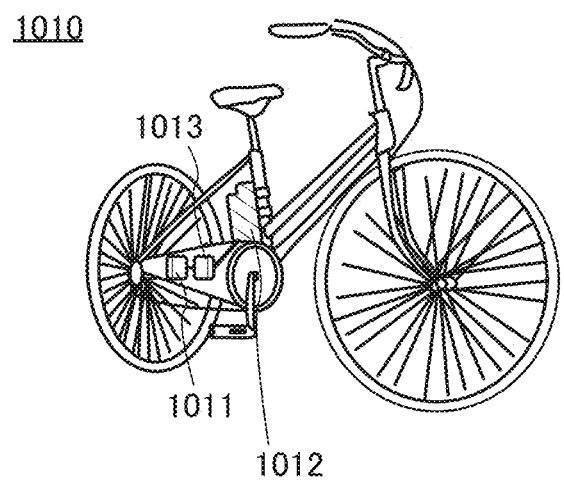
FIG. 12A is a view illustrating an electronic device using a semiconductor device.
Figure 12B:
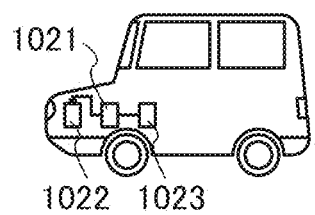
FIG. 12B is a view illustrating an electronic device using a semiconductor device.

Next, with reference to FIG. 12A and FIG. 12B, application examples of the electronic components which are applied to a driver circuit for driving an inverter, a motor, or the like, which is provided in a vehicle (e.g., a bicycle) that is driven with power from a fixed power supply, are described.

FIG. 12A illustrates an electric bicycle 1010 as an application example. The electric bicycle 1010 obtains power when current flows through a motor unit 1011. The electric bicycle 1010 includes a battery 1012 for supplying current to the motor unit 1011 and a driver circuit 1013 for driving the motor unit. Note that although a pedal is illustrated in FIG. 12A, the pedal is not necessarily provided.

A circuit board provided with an electronic component including the semiconductor device described in the above embodiment is incorporated in the driver circuit 1013. Therefore, an electric bicycle provided with an electronic component whose limit on a usage environment is relieved and whose size is reduced is obtained.

FIG. 12B illustrates an electric car 1020 as another application example. The electric car 1020 obtains power when current flows through a motor unit 1021. The electric car 1020 includes a battery 1022 for supplying current to the motor unit 1021 and a driver circuit 1023 for driving the motor unit.

A circuit board provided with an electronic component including the semiconductor device described in the above embodiment is incorporated in the driver circuit 1023. Therefore, an electric car provided with an electronic component whose limit on a usage environment is relieved and whose size is reduced is obtained.

As described above, a circuit broad provided with an electronic component including the semiconductor device described in the above embodiment is incorporated in each of the electronic devices described in this embodiment. Therefore, an electric car provided with an electronic component whose limit on a usage environment is relieved and whose size is reduced is obtained.

The structure, method, and the like described in this embodiment can be used in a combination as appropriate with the structures, the methods, and the like described in the other embodiments and the example.

Example

In this example, an aggregation state of a metal oxide film was analyzed. Specifically, selected area electron diffraction (SAED) was performed on a sample including a metal oxide film. The sample was observed by a dark field observation method and a bright field observation method.

First, the samples used in this example are described.

Figure 13A:
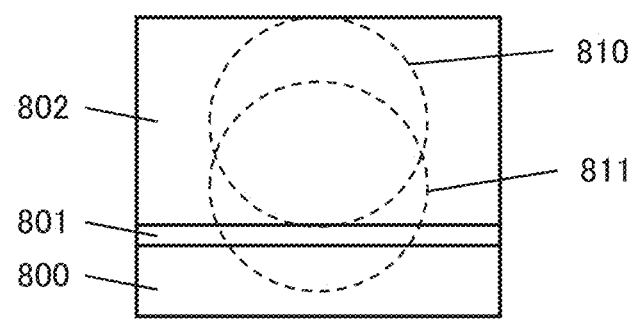
FIG. 13A is a view illustrating a structure of a sample for cross-sectional observation.

First, the samples are fabricated. As illustrated in FIG. 13A, the sample includes a substrate 800, an oxide film 801 over the substrate 800, and a metal oxide film 802 over the oxide film 801. The substrate 800 is a substrate containing silicon. The oxide film 801 is a 100-nm-thick silicon oxide film formed by performing heat treatment on a surface of the substrate 800 in a hydrogen chloride (HCl) atmosphere. The metal oxide film 802 is a 3-µm-thick IGZO film deposited by a sputtering method. In the deposition of the metal oxide film 802, an oxide target with In:Ga:Zn=4:2:4.1 [atomic ratio] was used; 30 sccm of an argon gas and 15 sccm of an oxygen gas were used as a deposition gas; the deposition pressure was 0.4 Pa; the deposition power was 500 W; the substrate temperature was 200° C.; and the distance between the target and the substrate was 60 cm.

Next, the samples were processed using focused ion beam (FIB), whereby a sample for cross-sectional observation and a sample for plan-view observation were fabricated.

The above is the description of the samples used in this example.

In order to observe the crystal structure of the metal oxide film 802, SAED was performed on the sample for cross-sectional observation. Note that a transmission electron microscope "H-9500" manufactured by Hitachi High-Technologies Corporation was used for the SAED. The diameter of a region measured by SAED (referred to as a selected area in some cases) is approximately 3 µm.

Note that since the metal oxide film 802 has a large thickness, in a selected area diffraction pattern obtained by SAED, the intensity of an electron beam spot can be high.

Figure 13B:
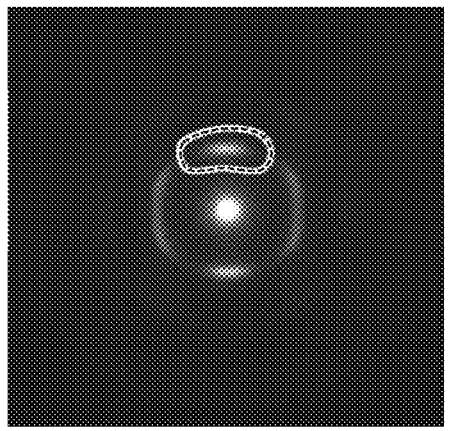
FIG. 13B and FIG. 13C are images each showing a nanobeam electron diffraction pattern of the sample for cross-sectional observation.
Figure 13C:
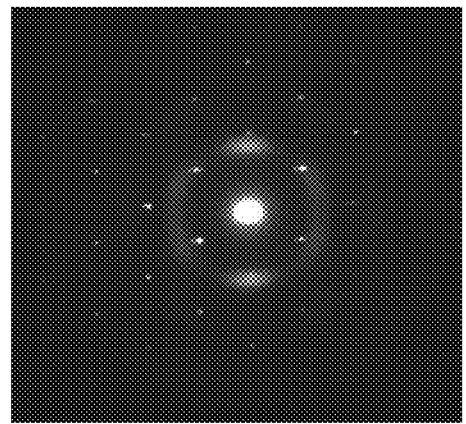

FIG. 13B and FIG. 13C show selected area diffraction patterns of the sample for cross-sectional observation, which were obtained by SAED. Note that selected areas in the selected area diffraction patterns shown in FIG. 13B and FIG. 13C correspond to a region 810 and a region 811, respectively, denoted by dotted circles in FIG. 13A. That is, FIG. 13B shows a selected area diffraction pattern in the case where the selected area is positioned in the metal oxide film 802. FIG. 13C shows a selected area diffraction pattern in the case where the selected area is positioned across the metal oxide film 802, the oxide film 801, and the substrate 800.

In each of the selected area diffraction patterns shown in FIG. 13B and FIG. 13C, a spot observed at the center is a spot of a transmission wave (000). An arched spot which is a region surrounded by the dotted line and observed above the center in FIG. 13B is a spot of a diffraction wave (009). FIG. 13B shows that the metal oxide film 802 is a CAAC-IGZO film.

Next, a bright field electron microscope image (also referred to as a bright field image) of the sample for cross-sectional observation was observed by the bright field observation method, which is a technique of forming an image by extracting a transmitted wave. Note that the transmitted wave used for forming an image is extracted by providing an objective diaphragm so that the transmitted wave is transmitted and the diffraction wave is blocked. The transmission electron microscope "H-9500" manufactured by Hitachi High-Technologies Corporation was used for the bright field image observation.

Figure 14:
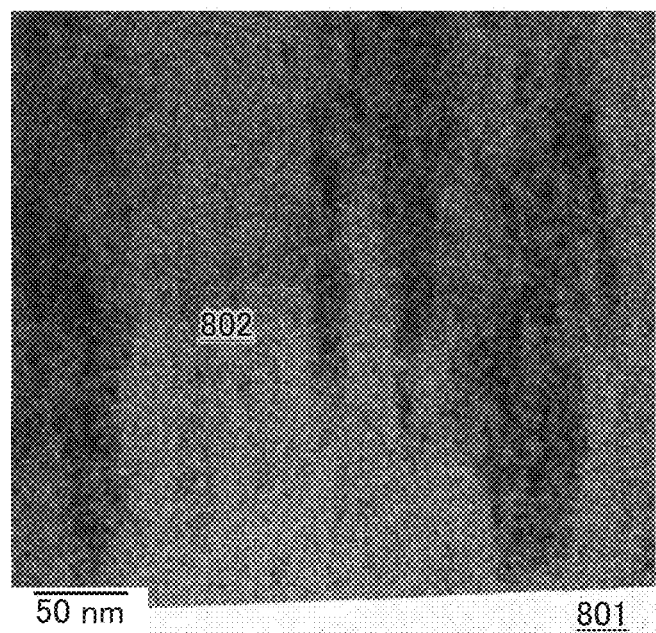
FIG. 14 is an image showing a bright field image of a sample for cross-sectional observation.

FIG. 14 shows a bright field image of the sample for cross-sectional observation. FIG. 14 is a bright field image of the metal oxide film 802 and the oxide film 801.

In the bright field image of the sample for cross-sectional observation, differential contrast was observed in the metal oxide film 802, as shown in FIG. 14. This contrast probably contains information derived from different crystal orientation. Accordingly, it is suggested that regions each having a size of several tens of nanometers and a different orientation order exist in the metal oxide film 802.

Next, in order to capture partial orientation state of the metal oxide film 802, a dark field electron microscope image (also referred to as a dark field image) of the sample for cross-sectional observation was observed by the dark field observation method, which is a technique of forming an image by extracting a particular diffraction wave. Note that the diffraction wave used for forming an image is extracted by providing an objective diaphragm so that the diffraction wave is transmitted and the transmitted wave is blocked. Since the diffraction wave is observed as a spot in the selected area diffraction pattern, the dark field image is sometimes referred to as a dark field image in the case where the spot of the diffraction wave observed in the selected area diffraction pattern is extracted using the objective diaphragm. The transmission electron microscope "H-9500" manufactured by Hitachi High-Technologies Corporation was used for the dark field image observation.

Figure 15A:
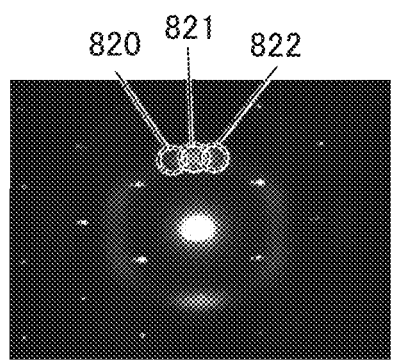
FIG. 15A is an image showing a selected area diffraction pattern of a sample for cross-sectional observation.

FIG. 15A shows a selected area electron diffraction pattern of the sample for cross-sectional observation. FIG. 15A shows a selected area diffraction pattern of the sample for cross-sectional observation near a surface of the metal oxide film 802.

Figure 15B:
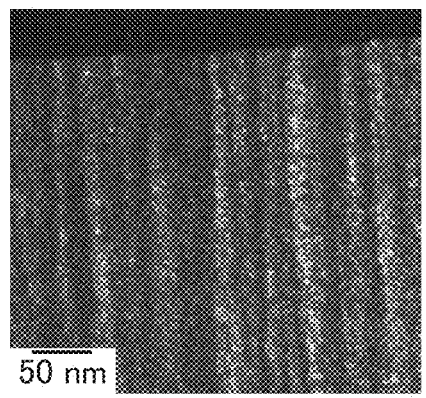
FIG. 15B to FIG. 15D are images each showing a dark field image near a surface of a metal oxide film utilizing a spot of a diffraction wave (009).
Figure 15C:
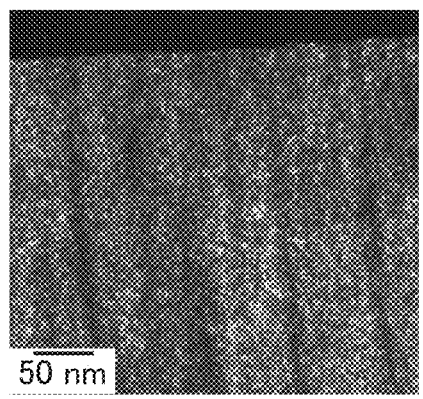
Figure 15D:
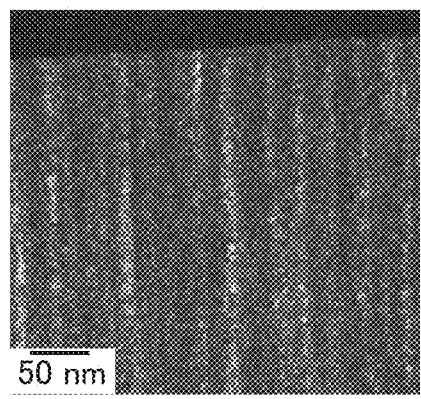

FIG. 15B to FIG. 15D show dark field images of the sample for cross-sectional observation. FIG. 15B to FIG. 15D are dark field images near the surface of the metal oxide film 802 utilizing the spot of the diffraction wave (009) observed in the selected area diffraction pattern in FIG. 15A. FIG. 15B is a dark field image in the case where a region 820 (the left side of the spot of the diffraction wave (009)) denoted by the dotted line in FIG. 15A is extracted with the objective diaphragm. FIG. 15C is a dark field image in the case where a region 821 (the center of the spot of the diffraction wave (009) and the vicinity thereof) denoted by the dotted line in FIG. 15A is extracted with the objective diaphragm. FIG. 15D is a dark field image in the case where a region 822 (the right side of the spot of the diffraction wave (009)) denoted by the dotted line in FIG. 15A is extracted with the objective diaphragm. Note that the dark field images shown in FIG. 15B to FIG. 15D are formed near the surface of the metal oxide film 802, which is the uppermost portion, and are all the same field of view.

In the dark field image in the case where the region 820 is extracted (see FIG. 15B) and in the dark field image in the case where the region 822 is extracted (see FIG. 15D), string-like contrast which is slightly tilted to the normal direction of the substrate surface was observed. Meanwhile, in the case where the region 821 is extracted (see FIG. 15C), a region with a differential orientation state was not clearly observed in the dark field image as compared with in the case where the region 820 is extracted and in the case field image the region 822 is extracted in the dark field image in the case. Note that in this cross-sectional observation, the thickness information on the sample fabricated by FIB processing is included as information on the depth direction, and thus there is a possibility that a crystal layer is formed while orientation order of the CAAC structure is tilted in the normal direction of the substrate surface.

Figure 16A:
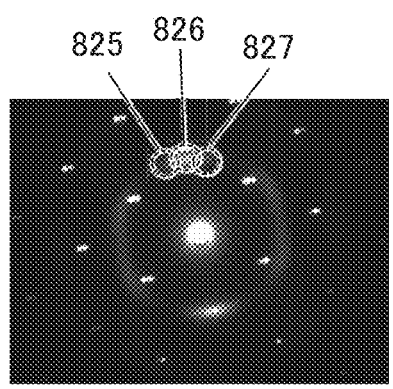
FIG. 16A is an image showing a selected area diffraction pattern of a sample for cross-sectional observation.

FIG. 16A shows a selected area electron diffraction pattern of the sample for cross-sectional observation. FIG. 16A shows a selected area diffraction pattern of the sample for cross-sectional observation near a surface of the oxide film 801.

Figure 16B:
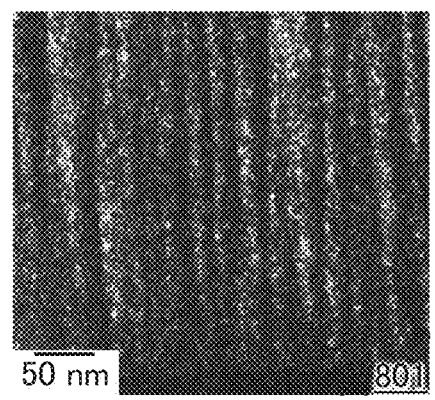
FIG. 16B to FIG. 16D are images each showing a dark field image near a surface of a silicon oxide film utilizing a spot of the diffraction wave (009).
Figure 16C:
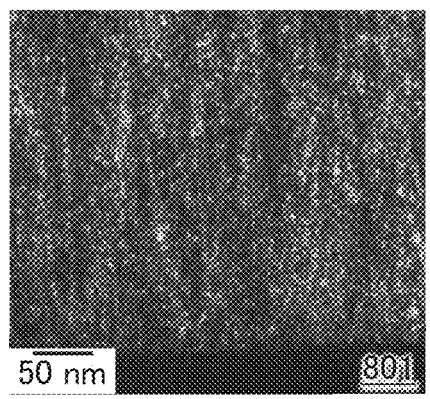
Figure 16D:
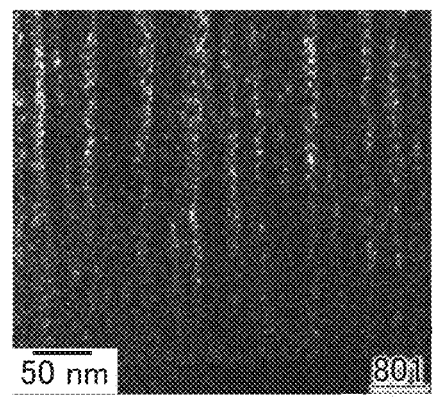

FIG. 16B to FIG. 16D show dark field images of the sample for cross-sectional observation. FIG. 16B to FIG. 16D are dark field images near the oxide film 801 utilizing the spot of the diffraction wave (009) observed in the selected area diffraction pattern in FIG. 16A. FIG. 16B is a dark field image in the case where a region 825 (the left side of the spot of the diffraction wave (009)) denoted by the dotted line in FIG. 16A is extracted with the objective diaphragm. FIG. 16C is a dark field image in the case where a region 826 (the center of the spot of the diffraction wave (009) and the vicinity thereof) denoted by the dotted line in FIG. 16A is extracted with the objective diaphragm. FIG. 16D is a dark field image in the case where a region 827 (the right side of the spot of the diffraction wave (009)) denoted by the dotted line in FIG. 16A is extracted with the objective diaphragm. Note that the dark field images shown in FIG. 16B to FIG. 16D are formed near the surface of the oxide film 801 and are all the same field of view.

Next, in order to reduce information on the depth direction as much as possible, a sample for cross-sectional observation processed to be thinner (thinned) only in the depth direction was fabricated, and the sample for cross-sectional observation was subjected to selected area diffraction pattern observation and dark field image observation.

Figure 17A:
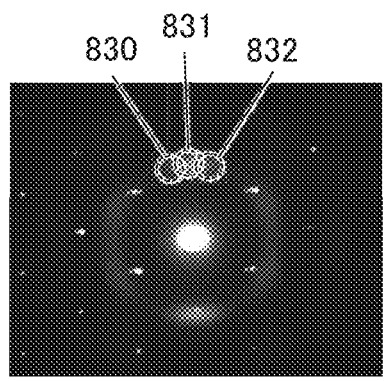
FIG. 17A is an image showing a selected area diffraction pattern of a sample for cross-sectional observation.

FIG. 17A shows a selected area diffraction pattern of the thinned sample for cross-sectional observation. FIG. 17A shows a selected area diffraction pattern of the thinned sample for cross-sectional observation near the surface of the metal oxide film 802.

Figure 17B:
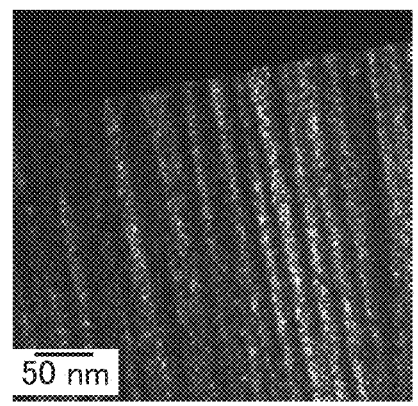
FIG. 17B to FIG. 17D are images each showing a dark field image near a surface of a metal oxide film utilizing a spot of the diffraction wave (009).
Figure 17C:
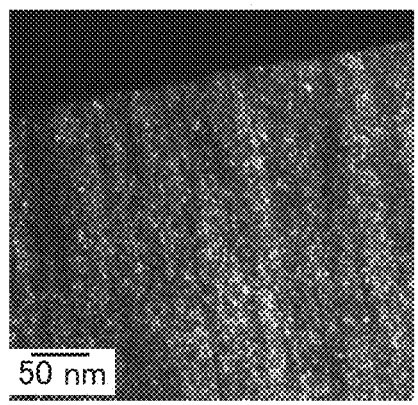
Figure 17D:
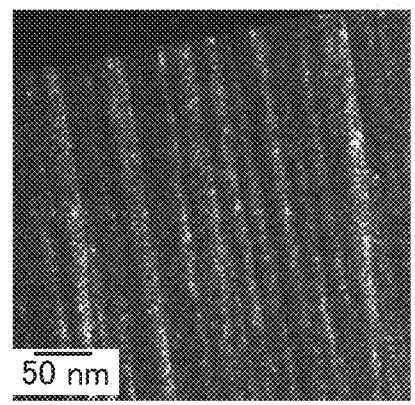

FIG. 17B to FIG. 17D show dark field images of the thinned sample for cross-sectional observation. FIG. 17B to FIG. 17D are dark field images near the surface of the metal oxide film 802 utilizing the spot of the diffraction wave (009) observed in the selected area diffraction pattern in FIG. 17A. FIG. 17B is a dark field image in the case where a region 830 (the left side of the spot of the diffraction wave (009)) denoted by the dotted line in FIG. 17A is extracted with the objective diaphragm. FIG. 17C is a dark field image in the case where a region 831 (the center of the spot of the diffraction wave (009) and the vicinity thereof) denoted by the dotted line in FIG. 17A is extracted with the objective diaphragm. FIG. 17D is a dark field image in the case where a region 832 (the right side of the spot of the diffraction wave (009)) denoted by the dotted line in FIG. 17A is extracted with the objective diaphragm. Note that the dark field images shown in FIG. 17B to FIG. 17D are formed near the surface of the metal oxide film 802, which is the uppermost portion, and are all the same field of view.

In the dark field image in the case where the region 830 is extracted (see FIG. 17B) and in the dark field image in the case where the region 832 is extracted (see FIG. 17D), a bundle of contrast which is slightly tilted from a direction perpendicular to the substrate surface was observed. Meanwhile, in the case where the region 831 is extracted (see FIG. 17C), a crystal group having a differential orientation state was hardly observed on the whole in the dark field image as compared with in the case where the region 830 is extracted and in the case where the region 832 is extracted. Thus, the metal oxide film 802 probably includes a crystal group having an extremely long orientation organization in the direction perpendicular to the substrate surface. Furthermore, contrast was observed in different orientation regions in the dark field image in the case where the region 830 is extracted and in the dark field image in the case where the region 832 is extracted. Accordingly, assuming that contrast in different regions is continuous contract with the dark field image in the case where the region 831 is extracted therebetween, the continuity of a crystal group in the metal oxide film 802 is probably maintained even when string-like contrast is observed.

Note that in the dark field image in the case where the region 831 is extracted (see FIG. 17C), it is assumed that information on a crystal group oriented in various directions is put together to form an image. This is probably because information on a crystal group oriented obliquely in the depth direction of the sample for cross-sectional observation is lost due to the sample for cross-sectional observation to be thinned, and then the diffraction intensity of a crystal group having an orientation vector that is close to the depth direction of the sample for cross-sectional observation is not sufficiently obtained. Thus, information on the crystal group having an orientation vector that is close to the depth direction of the sample for cross-sectional observation is probably not brightly observed in the dark field image in the case where the region (the region 830 and the region 832) outside the center of the spot of the diffraction wave (009) is extracted.

Figure 18A:
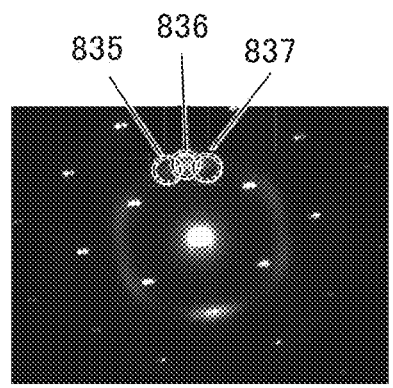
FIG. 18A is an image showing a selected area diffraction pattern of a sample for cross-sectional observation.

FIG. 18A shows a selected area diffraction pattern of the thinned sample for cross-sectional observation. FIG. 18A shows a selected area diffraction pattern of the thinned sample for cross-sectional observation near the oxide film 801.

Figure 18B:
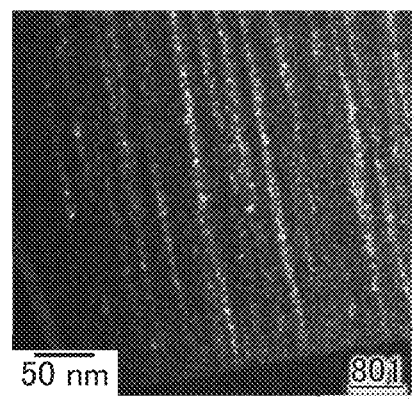
FIG. 18B to FIG. 18D are images each showing a dark field image near a surface of a silicon oxide film utilizing a spot of the diffraction wave (009).
Figure 18C:
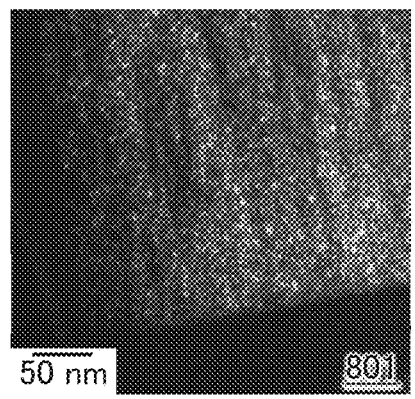
Figure 18D:
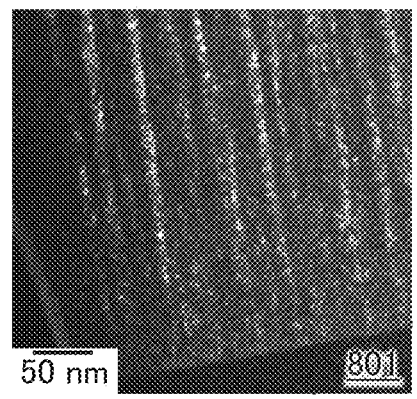

FIG. 18B to FIG. 18D show dark field images of the thinned sample for cross-sectional observation. FIG. 18B to FIG. 18D are dark field images near the oxide film 801 utilizing the spot of the diffraction wave (009) observed in the selected area diffraction pattern in FIG. 18A. FIG. 18B is a dark field image in the case where a region 835 (the left side of the spot of the diffraction wave (009)) denoted by the dotted line in FIG. 18A is extracted with the objective diaphragm. FIG. 18C is a dark field image in the case where a region 836 (the center of the spot of the diffraction wave (009) and the vicinity thereof) denoted by the dotted line in FIG. 18A is extracted with the objective diaphragm. FIG. 18D is a dark field image in the case where a region 837 (the right side of the spot of the diffraction wave (009)) denoted by the dotted line in FIG. 18A is extracted with the objective diaphragm. Note that the dark field images shown in FIG. 18B to FIG. 18D are formed near the surface of the oxide film 801 and are all the same field of view.

As seen from FIG. 18B to FIG. 18D, string-like contrast having a width of approximately 10 nm and showing an oriented region that extends in the normal direction of the substrate was obtained. Furthermore, it was also found that the growth of a crystal layer of the metal oxide film 802 begins at a point less than 1 nm from the interface with the oxide film 801, and the crystal layer is oriented at a tilt in the normal direction of the substrate by approximately 2° to 3°.

In order to evaluate the distribution of the crystal layers having a long-range order observed as string-like contrast in the thinned sample for cross-sectional observation, a dark field image of the sample for plan-view observation in the case where the spot of the diffraction wave (100) was extracted with the objective diaphragm was observed. Note that an atomic resolution analytical electron microscope "JEM-ARM200F" manufactured by JEOL Ltd. was used for the sample for the selected-area electron diffraction pattern observation, the dark field image observation, the bright field image observation, and a high-resolution image observation performed on the sample for plan-view observation.

Figure 19A:
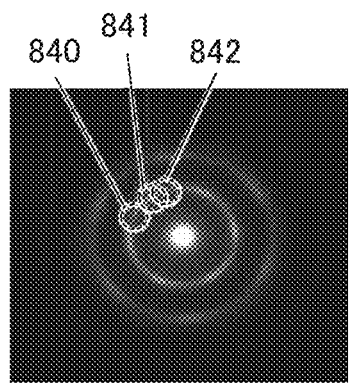
FIG. 19A is an image showing a selected area diffraction pattern of a sample for plan-view observation.

FIG. 19A shows a selected area electron diffraction pattern of the sample for plan-view observation. FIG. 19A shows a selected area diffraction pattern of the sample for plan-view observation of the metal oxide film 802.

Figure 19B:
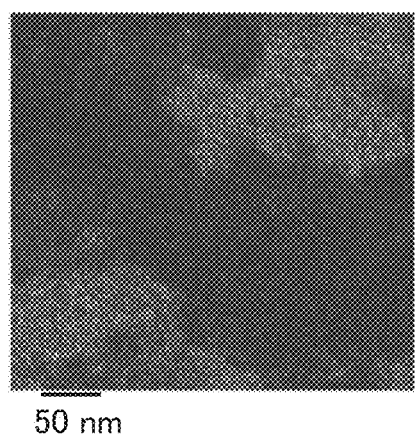
FIG. 19B to FIG. 19D are images each showing a dark field image near a surface of a metal oxide film utilizing a spot of a diffraction wave (100).
Figure 19C:
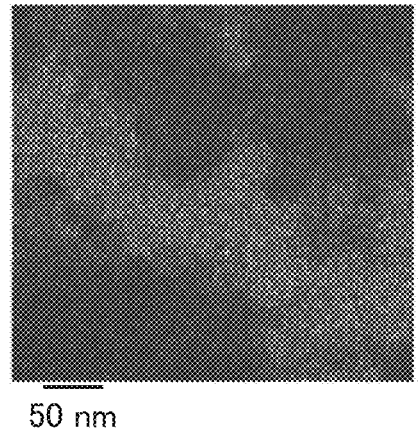
Figure 19D:
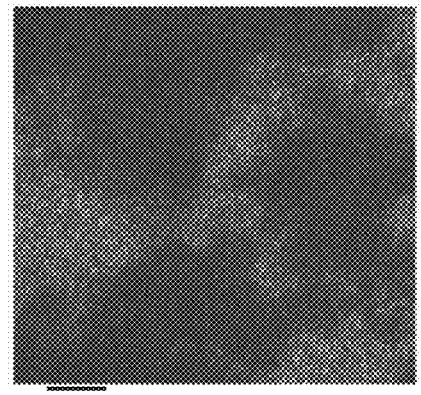

FIG. 19B to FIG. 19D show dark field images of the sample for plan-view observation. FIG. 19B to FIG. 19D are dark field images of the metal oxide film 802 utilizing the spot of the diffraction wave (100) observed in the selected area diffraction pattern in FIG. 19A. FIG. 19B is a dark field image in the case where a region 840 (the left side of one spot of the diffraction wave (100)) denoted by the dotted line in FIG. 19A is extracted with the objective diaphragm. FIG. 19C is a dark field image in the case where a region 841 (the center of one spot of the diffraction wave (100) and the vicinity thereof) denoted by the dotted line in FIG. 19A is extracted with the objective diaphragm. FIG. 19D is a dark field image in the case where a region 842 (the right side of one spot of the diffraction wave (100)) denoted by the dotted line in FIG. 19A is extracted with the objective diaphragm. Note that the dark field images shown in FIG. 19B to FIG. 19D are all the same field of view.

As seen from FIG. 19B to FIG. 19D, in the metal oxide film 802, orientation orders shown as the spots of the diffraction wave (100) each having a size of approximately 100 nm are distributed, and contrast in the dark field image formed by connecting this vertical oriented region and oriented regions tilted from the vertical oriented region by several degrees was observed.

Figure 20A:
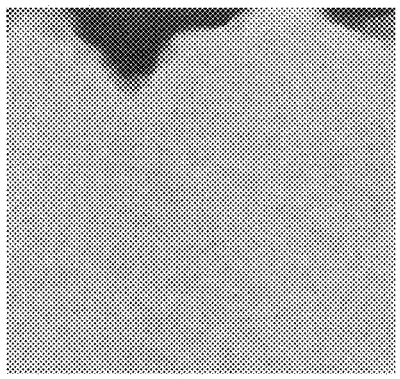
FIG. 20A is an image showing a bright field image of a sample for plan-view observation.
Figure 20B:
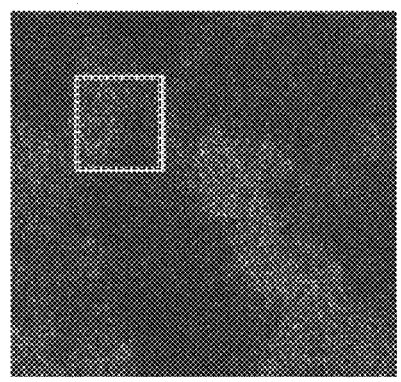
FIG. 20B is an image showing a dark field image of the sample for plan-view observation.
Figure 20C:
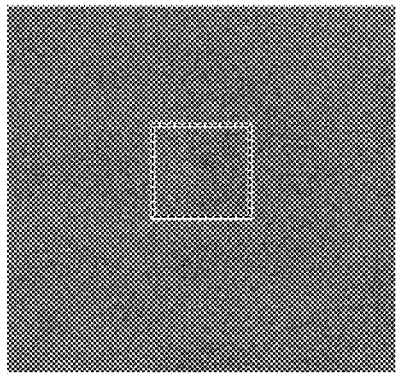
FIG. 20C and FIG. 20D are images each showing a high-resolution image of the sample for plan-view observation.
Figure 20D:
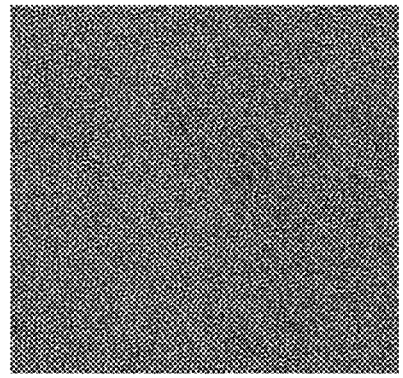

FIG. 20A shows a bright field image of the sample for plan-view observation. FIG. 20B shows a dark field image of the sample for plan-view observation. FIG. 20C and FIG. 20D show high-resolution images of the sample for plan-view observation. Note that a region of the bright field image shown in FIG. 20A and a region of the dark field image shown in FIG. 20B are the same. The high-resolution image shown in FIG. 20C is an image of a region denoted by the dotted line in FIG. 20B. In addition, the high-resolution image shown in FIG. 20D is an image of a region denoted by the dotted line in FIG. 20C.

As seen from FIG. 20B to FIG. 20D, long-range orientation order that cannot be observed in the high-resolution image was able to be observed from the dark field image.

As described above, it was found that the CAAC-IGZO film has continuous crystal orientation even in a region between the level of nanometers, which is larger than the atomic level, and a bulk (what is called a mesoscopic region).

At least part of the structure, the method, and the like described in this example can be implemented in appropriate combination with other embodiments described in this specification.

REFERENCE NUMERALS 200 transistor, 210 substrate, 230 oxide, 230a oxide, 230b oxide, 240 opening, 240_1 opening, 240_2 opening, 240_3 opening, 240_4 opening, 242 conductor, 243 metal oxide, 245 metal oxide, 246 conductor, 248 conductor, 250 insulator, 250_1 insulator, 2502 insulator, 2503 insulator, 250_4 insulator, 250A insulating film, 260 conductor, 260_1 conductor, 260_2 conductor, 260_3 conductor, 2604 conductor, 260A conductive film, 271 insulator, 272 insulator, 700 electronic component, 701 lead, 702 printed circuit, 703 semiconductor device, 704 circuit board, 800 substrate, 801 oxide film, 802 metal oxide film, 810 region, 811 region, 820 region, 821 region, 822 region, 825 region, 826 region, 827 region, 830 region, 831 region, 832 region, 835 region, 836 region, 837 region, 840 region, 841 region, 842 region, 1010 electric bicycle, 1011 motor unit, 1012 battery, 1013 driver circuit, 1020 electric car, 1021 motor unit, 1022 battery, 1023 driver circuit, 4000 apparatus, 4010 atmosphere-side substrate supply chamber, 4012 atmosphere-side substrate transfer chamber, 4014 cassette port, 4016 alignment port, 4018 transfer robot, 4020a load lock chamber, 4020b unload lock chamber, 4024a treatment chamber, 4024b treatment chamber, 4026 transfer robot, 4028 gate valve, 4029 transfer chamber, 4030a delivering chamber, 4030b delivering chamber, 4034a treatment chamber, 4034b treatment chamber, 4034c treatment chamber, 4034d treatment chamber, 4034e treatment chamber, 4036 transfer robot, 4038 gate valve, 4039 transfer chamber

The invention claimed is:

1. A semiconductor device comprising:
   a substrate;
   a first conductor over the substrate;
   a first metal oxide over the first conductor;
   a first oxide over and in contact with the first metal oxide;
   a second oxide over the first oxide;
   a first insulator over the second oxide;
   a second conductor over the first insulator;
   a second insulator over the second conductor;
   a third insulator in contact with a side surface of the second conductor, a side surface of the first insulator, and a side surface of the second insulator;
   a second metal oxide over the second oxide, the second insulator, and the third insulator; and
   a third conductor over the second metal oxide, the third conductor being in contact with a top surface of the second metal oxide,
   wherein the second conductor comprises a region overlapping with the second oxide,
   wherein the third conductor comprises a region in contact with the second metal oxide,
   wherein the second metal oxide comprises a region in contact with the second oxide,
   wherein a carrier concentration of the second oxide is lower than a carrier concentration of the first oxide,
   wherein a carrier concentration of the first metal oxide is higher than the carrier concentration of the first oxide, and
   wherein a carrier concentration of the second metal oxide is higher than the carrier concentration of the first oxide.

2. The semiconductor device according to claim 1,
   wherein the first oxide and the second oxide comprise In, an element M, and Zn, and
   wherein M is Al, Ga, Y, or Sn.

3. The semiconductor device according to claim 1,
   wherein the first metal oxide and the second metal oxide comprise In and one or more of Sn, W, Ti, and Si.

4. The semiconductor device according to claim 2,
   wherein the first metal oxide and the second metal oxide comprise In and one or more of Sn, W, Ti, and Si.

5. A semiconductor device comprising:
   a substrate;
   a first conductor over the substrate;
   a first metal oxide over the first conductor;
   a first oxide over and in contact with the first metal oxide;
   a second oxide over the first oxide;
   a first insulator over the second oxide;
   a second conductor over the first insulator;
   a second insulator over the second conductor;
   a third insulator in contact with a side surface of the second conductor, a side surface of the first insulator, and a side surface of the second insulator;
   a second metal oxide over the second oxide, the second insulator, and the third insulator; and
   a third conductor over the second metal oxide, the third conductor being in contact with a top surface of the second metal oxide,
   wherein the second conductor comprises a region overlapping with the second oxide,
   wherein the third conductor comprises a region in contact with the second metal oxide,
   wherein the second metal oxide comprises a region in contact with the second oxide,
   wherein an atomic ratio of indium in the first oxide is higher than an atomic ratio of indium in the second oxide, and
   wherein the first metal oxide and the second metal oxide comprise a conductive oxide.

6. The semiconductor device according to claim 5,
   wherein the first oxide and the second oxide comprise In, an element M, and Zn, and
   wherein M is Al, Ga, Y, or Sn.

7. The semiconductor device according to claim 5,
   wherein the first metal oxide and the second metal oxide comprise In and one or more of Sn, W, Ti, and Si.

8. The semiconductor device according to claim 6,
   wherein the first metal oxide and the second metal oxide comprise In and one or more of Sn, W, Ti, and Si.

* * * * *